(12) United States Patent
Hung et al.

(10) Patent No.: US 7,577,017 B2
(45) Date of Patent: Aug. 18, 2009

(54) HIGH-BANDWIDTH MAGNETORESISTIVE RANDOM ACCESS MEMORY DEVICES AND METHODS OF OPERATION THEREOF

(75) Inventors: Chien-Chung Hung, Hsinchu (TW); Ming-Jer Kao, Hsinchu (TW); Yuan-Jen Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/581,466

(22) Filed: Oct. 17, 2006

(65) Prior Publication Data

US 2007/0171704 A1 Jul. 26, 2007

Related U.S. Application Data

(60) Provisional application No. 60/760,373, filed on Jan. 20, 2006.

(51) Int. Cl.
 *G11C 11/00* (2006.01)
(52) U.S. Cl. .................. 365/158; 365/189.07
(58) Field of Classification Search ................ 365/158, 365/189.07
 See application file for complete search history.

(56) References Cited

U.S. PATENT DOCUMENTS

| 6,545,906 | B1 | 4/2003 | Savtchenko et al. | |
| 6,693,824 | B2 * | 2/2004 | Nahas et al. | 365/158 |
| 6,757,189 | B2 | 6/2004 | Hung et al. | |
| 6,791,887 | B2 | 9/2004 | Hung et al. | |
| 6,826,076 | B2 * | 11/2004 | Asano et al. | 365/158 |
| 6,862,228 | B2 | 3/2005 | Hung et al. | |
| 6,909,631 | B2 * | 6/2005 | Durlam et al. | 365/158 |
| 2005/0195673 | A1 * | 9/2005 | Asao et al. | 365/222 |

OTHER PUBLICATIONS

C. C. Hung et al., "High Density and Low Power Design of MRAM," 0-7803-8684-1/04 (2004).
Chien-Chung Hung et al., "A 6-$F^2$ Bit Cell Design Based on One Transistor and Two Uneven Magnetic Tunnel Junctions Structure and Low Power Design for MRAM," IEEE Transactions on Electron Devices, vol. 53, No. 7, Jul. 2006, pp. 1530-1538.

* cited by examiner

*Primary Examiner*—Hoai V Ho
(74) *Attorney, Agent, or Firm*—Finnegan, Henderson, Farabow, Garrett & Dunner LLP

(57) ABSTRACT

A method for accessing a memory cell of a magnetoresistive random access memory (MRAM) device, where the memory cell includes a plurality of memory units, includes writing the memory cell by identifying ones of the memory units having stored therein a datum different from a datum to be written thereto; and simultaneously writing all of the ones of the memory units. An MRAM device includes a plurality of write word lines, a plurality of write bit lines, and a plurality of memory cells. Each memory cell includes a plurality of memory units. Each memory unit includes a free magnetic region having one or more easy axes non-perpendicular to the write bit lines and non-perpendicular to the write word lines, a pinned magnetic region, and a tunneling barrier between the free magnetic region and the pinned magnetic region.

18 Claims, 23 Drawing Sheets

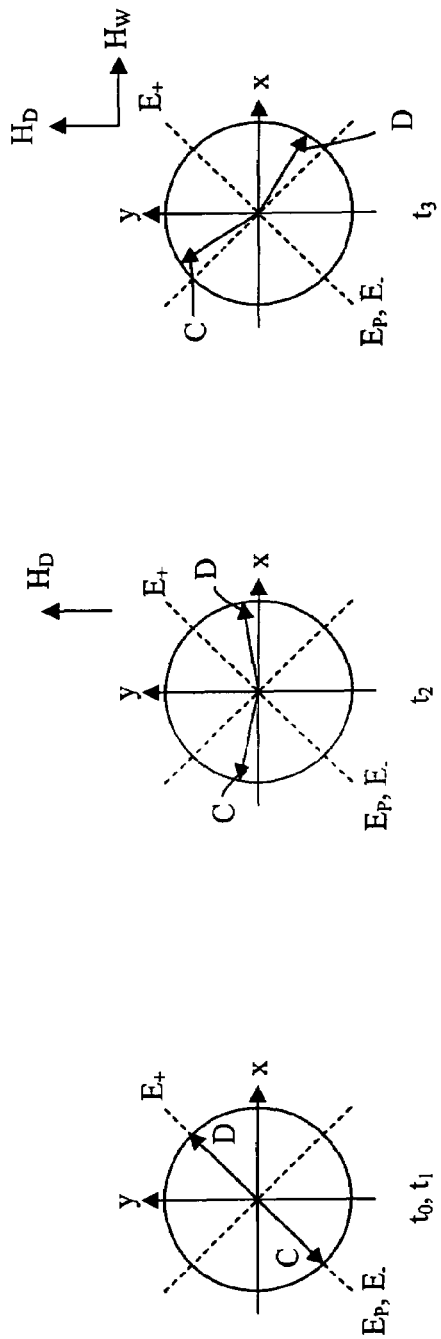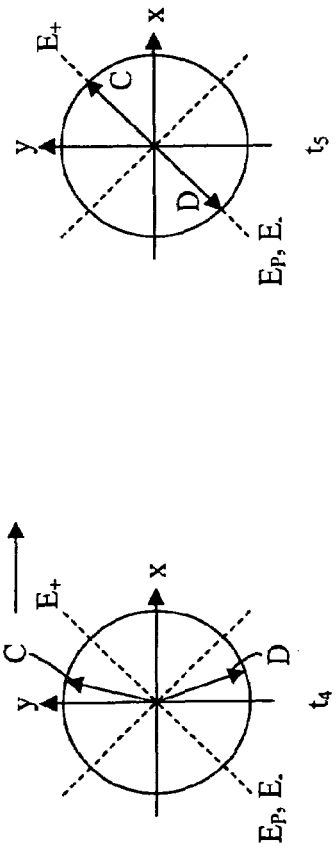

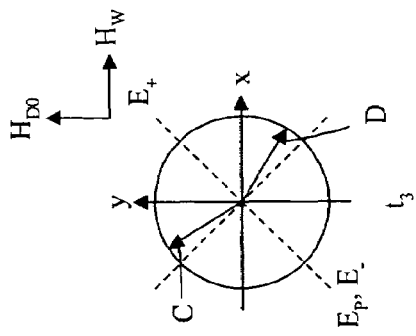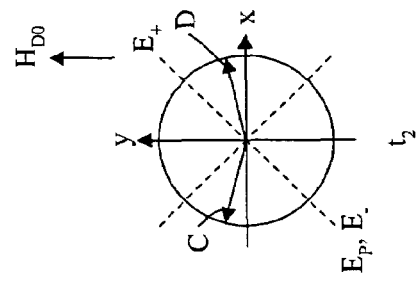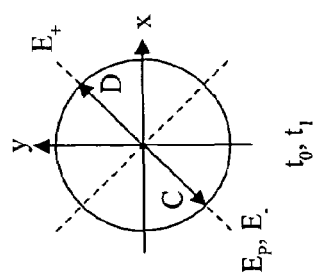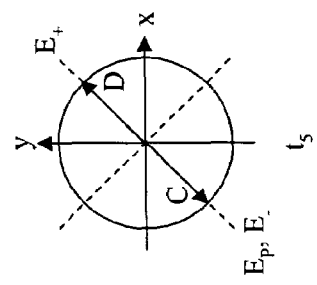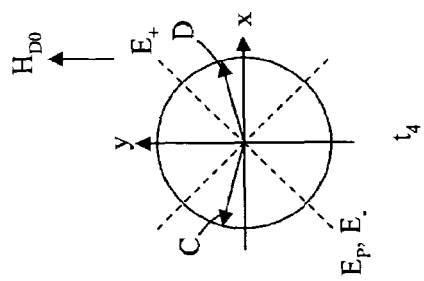
Fig. 10(a) $t_0, t_1$
Fig. 10(b) $t_2$
Fig. 10(c) $t_3$
Fig. 10(d) $t_4$
Fig. 10(e) $t_5$

HIGH-BANDWIDTH MAGNETORESISTIVE RANDOM ACCESS MEMORY DEVICES AND METHODS OF OPERATION THEREOF

BENEFIT OF PRIORITY

The present application is related to, and claims the benefit of priority of, U.S. Provisional Application No. 60/760,373, filed on Jan. 20, 2006, entitled "Multiple Data Rate MRAM", the entire contents of which are incorporated herein by reference.

DESCRIPTION OF THE INVENTION

1. Field of the Invention

This invention relates in general to high-bandwidth magnetoresistive random access memory (MRAM) devices and methods for operating the same.

2. Background

MRAM devices have been proposed as an alternative to conventional memory devices such as static random access memories (SRAM), dynamic random access memories (DRAM), and flash memories. MRAM devices store data using a magnetoresistance effect, which refers to a phenomenon wherein electrical resistance of a material changes with magnetic fields to which the material is subjected. As compared to these conventional memories, MRAM devices excel in speed, integration density, power consumption, radiation hardness, and endurance.

FIG. 1 shows an exemplary MRAM device 100 including an array of memory cells. Only one of the memory cells, memory cell 102, is shown. MRAM device 100 includes a plurality of write bit lines 104 and a plurality of write word lines 106. Write bit lines 104 and write word lines 106 are substantially perpendicular to each other. Each memory cell corresponds to one write bit line 104 and one write word line 106.

Memory cell 102 includes a pinned magnetic region 108, a free magnetic region 110, and a tunneling barrier 112 sandwiched between pinned magnetic region 108 and free magnetic region 110. Tunneling barrier 112 may comprise, for example, aluminum oxide ($Al_2O_3$) or magnesium oxide (MgO).

Pinned magnetic region 108 may comprise a pinned ferromagnet or a synthetic anti-ferromagnetic (SAF) structure. FIG. 1 shows that pinned magnetic region 108 comprises a three-layered SAF structure including two ferromagnetic layers 114 and 116 sandwiching an anti-ferromagnetic coupling spacer layer 118. Ferromagnetic layers 114 and 116 may comprise, for example, cobalt-iron (CoFe), nickel-iron (NiFe), or cobalt-iron-boron (CoFeB). Anti-ferromagnetic coupling spacer layer 118 may comprise, for example, ruthenium (Ru) or copper (Cu). A thickness of anti-ferromagnetic coupling spacer layer 118 is selected such that ferromagnetic layers 114 and 116 are anti-ferromagnetically coupled to each other.

Free magnetic region 110 may comprise a single free magnetic layer or an SAF structure. FIG. 1 shows that free magnetic region 110 includes two ferromagnetic layers 120 and 122 sandwiching an anti-ferromagnetic coupling spacer layer 124. Ferromagnetic layers 120 and 122 may comprise, for example, cobalt-iron (CoFe), cobalt-iron-boron (CoFeB), or nickel-iron (NiFe). Anti-ferromagnetic coupling spacer layer 124 may comprise, for example, ruthenium (Ru) or copper (Cu). A thickness of anti-ferromagnetic coupling spacer layer 124 is selected such that ferromagnetic layers 120 and 122 are anti-ferromagnetically coupled to each other. If the magnetic moments of ferromagnetic layers 120 and 122 are significantly different, then the SAF structure may be equivalent to a single free magnetic layer.

An anti-ferromagnetic pinning layer 126, a buffer layer 128, a bottom electrode 130, and a dielectric layer 132 are sequentially provided between pinned magnetic region 108 and write word line 106. Anti-ferromagnetic pinning layer 126 may comprise, for example, platinum manganese (PtMn) or manganese iridium (MnIr). Buffer layer 128 may comprise, for example, nickel-iron (NiFe), nickel-iron-chromium (NiFeCr), or nickel-iron-cobalt (NiFeCo). A top electrode 134 is provided on free magnetic region 110 and a dielectric layer 136 is provided between top electrode 134 and write bit line 104.

Anti-ferromagnetic pinning layer 126 pins a magnetic moment of pinned magnetic region 108, such that the magnetic moment of pinned magnetic region 108 does not rotate when a moderate magnetic field is applied. In contrast, a magnetic moment of free magnetic region 110 is free to rotate under an external magnetic field. Pinned magnetic region 108 has an easy axis along the direction of write word line 106, and free magnetic region 110 has two easy axes anti-parallel to each other and also along the direction of write word line 106. Easy axis as known in the art and used herein refers to an intrinsic orientation of magnetic dipole moments of an anisotropic material in the absence of an external magnetic or biasing field.

An electron tunneling barrier of tunneling barrier 112 and, therefore, a resistance of memory cell 102, change with magnetic fields. For example, when the respective magnetic moment vectors of ferromagnetic layers 116 and 120 are parallel to each other, tunneling barrier 112 has a low electron tunneling barrier and memory cell 102 has a low resistance. When the respective magnetic moment vectors of ferromagnetic layers 116 and 120 are anti-parallel to each other, tunneling barrier 112 has a high electron tunneling barrier and memory cell 102 has a high resistance. Thus, memory cell 102 may store one bit of "1" or "0" defined by the value of the resistance thereof. For example, a high resistance of memory cell 102 may represent a bit of "1" and a low resistance of memory cell 102 may represent a bit of "0", or the converse.

A bit of datum may be written into memory cell 102 by adjusting magnetic moment vectors of ferromagnetic layers 120 and 122 (so-called "spin flop") to rotate the magnetic moment vectors of ferromagnetic layers 120 and 122, such that the magnetic moment vector of ferromagnetic layer 120 is parallel or anti-parallel to the magnetic moment vector of ferromagnetic layer 116. In particular, appropriate currents may be provided to write bit line 104 and write word line 106 to induce external magnetic fields, which change the magnetic moments of ferromagnetic layers 120 and 122. A digit current $I_D$ through write bit line 104 induces a circular digit magnetic field $H_D$, and a word current $I_W$ through write word line 106 induces a circular word magnetic field $H_W$. The strength of magnetic fields $H_D$ and $H_W$ are respectively proportional to digit current $I_D$ and word current $I_W$. It is assumed that write bit line 104 is above memory cell 102 and write word line 106 is below memory cell 102. Thus, when digit current $I_D$ flows from left to right, $H_D$ is substantially in the direction from outside the paper into the paper in the plane of memory cell 102, as indicated in FIG. 1. Conversely, when digit current $I_D$ flows from right to left, $H_D$ is substantially in the direction from inside the paper coming out of the paper in the plane of memory cell 102. Similarly, when word current $I_W$ flows into the paper from outside the paper, $H_W$ is substantially in the direction from left to right in the plane of memory cell 102, as indicated in FIG. 1. To write a bit of datum to memory cell 102, a word current $I_W$ through write word line 106 is first provided to generate a word magnetic field $H_W$ in a direction perpendicular to the easy axes of free magnetic region 110 in the plane of memory cell 102. As a result, the magnetic moment vector of ferromagnetic layer 120 is aligned in a direction approximately perpendicular to the easy axes of free magnetic region 110. Then, a digit current $I_D$ through write bit line 104 is provided to generate a digit magnetic field $H_D$ in a direction of one of the easy axes of free magnetic region 110. As a result, the magnetic moment of ferromagnetic layer 120 is aligned with the one of the easy axes of free magnetic region 110. If digit magnetic field $H_D$ is in a direction parallel to the easy axis of pinned magnetic region 108, a bit of "0" is written into memory cell 102. If digit magnetic field $H_D$ is in a direction anti-parallel to the easy axis of pinned magnetic region 108, a bit of "1" is written into memory cell 102.

Memory cell 102 may be read by sensing the resistance thereof. MRAM device 100 includes a plurality of read word lines (not shown) and a plurality of read bit lines. Each memory cell corresponds to one read word line and one read bit line and includes a transistor coupled the corresponding read word line. MRAM device 100 also includes a plurality of sense amplifiers each coupled to one of the read bit lines to sense a current therethrough. As FIG. 1 shows, a transistor 138 is coupled to bottom electrode 130 of memory cell 102, and a sense amplifier 140 is coupled to top electrode 134 of memory cell 102. The corresponding read word line is coupled to the gate of transistor 138. The corresponding read bit line is coupled to top electrode 134. To read the datum stored in memory cell 102, the corresponding read word line and read bit line are activated to select memory cell 102. Transistor 138 is thus turned on, a voltage is applied between top electrode 134 and bottom electrode 130, and a current through memory cell 102 is sensed by sense amplifier 140. As FIG. 1 shows, sense amplifier 140 is also coupled to sense a reference current through a reference cell (not shown). Sense amplifier 140 compares the current through memory cell 102 with the reference current to determine a state of memory cell 102.

In one aspect, top electrode 134 of memory cell 102 may be electrically connected to corresponding write bit line 104 through a metal plug (not shown) formed in dielectric layer 136. Thus, one bit line serves as both the write bit line and the read bit line.

U.S. Pat. No. 6,757,189 to Hung et al. discloses a high-density MRAM device, in which each memory cell of the high-density MRAM device includes multiple magnetic memory units for storing multiple data bits. FIG. 2 shows a high-density MRAM device 200 as disclosed in Hung et al.

As FIG. 2 shows, MRAM device 200 includes a plurality of memory cells 202, of which $202_1$, $202_2$, $202_3$, $202_4$ are shown. Each memory cell 202 corresponds to a bit line BL, a read word line RWL, and two write word lines WWL. Each memory cell 202 includes two memory units $102_1$ and $102_2$ connected in parallel. For example, memory cell $202_1$ includes two memory units $102_1$ and $102_2$, and a transistor 138. Each of memory units $102_1$ and $102_2$ has the same structure as memory cell 102 in FIG. 1. Each bit line BL acts as both a write bit line and a read bit line. Memory units $102_1$ and $102_2$ are connected in parallel between the drain of transistor 138 and the corresponding bit line BL. The source of transistor 138 is grounded. The gate of transistor 138 is connected to the corresponding read word line RWL. In FIG. 2, memory units $102_1$ of memory cells $202_1$ and $202_2$ correspond to a first write word line WWL1; memory units $102_2$ of memory cells $202_1$ and $202_2$ correspond to a second write word line WWL2; memory units $102_1$ of memory cells $202_3$ and $202_4$ correspond to a first write word line WWL3; memory units $102_2$ of memory cells $202_3$ and $202_4$ correspond to a second write word line WWL4. In addition, memory cells $202_1$ and $202_2$ correspond to a first read word line RWL1; memory cells $202_3$ and $202_4$ correspond to a second read word line RWL2; memory cells $202_1$ and $202_3$ correspond to a first bit line BL1; and memory cells $202_2$ and $202_4$ correspond to a second bit line BL2. Each of bit lines BL1 and BL2 is also coupled to sense amplifier 140 through a transistor 204. Because each memory cell 202 includes two memory units $102_1$ and $102_2$, MRAM 200 has a high density of data storage.

MRAM 200 is manufactured such that $R_{1max}//R_{2max}$, $R_{1max}//R_{2min}$, $R_{1min}//R_{2max}$, $R_{1min}//R_{2min}$ all have different values, wherein $R_{1max}$ is the high resistance of memory unit $102_1$, $R_{1min}$ is the low resistance of memory unit $102_1$, $R_{2max}$ is the high resistance of memory unit $102_2$, $R_{2min}$ is the low resistance of memory unit $102_2$, and $R_1//R_2$ represents two resistances $R_1$ and $R_2$ connected in parallel. One of memory cells 202 to be read is first selected by enabling the corresponding read word line RWL, and sense amplifier 140 detects the current through the corresponding bit line BL. Sense amplifier 140 compares the detected current with three intermediate reference currents, Ref1, Ref2, Ref3, where Ref1, Ref2, Ref3 respectively correspond to three reference resistance values, R1, R2, R3, between $R_{1max}//R_{2max}$, $R_{1max}//R_{2min}$, $R_{1min}//R_{2max}$, and $R_{1min}//R_{2min}$. Assume, for example, $R_{1max}//R_{2max} > R1 > R_{1max}//R_{2min} > R2 > R_{1min}//R_{2max} > R3 > R_{1min}//R_{2min}$. Thus, if the detected current is between Ref1 and Ref2, then the resistance of the selected memory cell $202_1$ is $R_{1max}//R_{2min}$. Consequently, memory unit $102_1$ of the selected memory cell 202 has a bit of "1" stored therein, and memory unit $102_2$ of the selected memory cell 202 has a bit of "0" stored therein.

FIG. 3A shows a clock signal CLK and a sequence of signals on first read word line RWL1 and first bit line BL1 for reading memory cell $202_1$. On a rising edge of clock signal CLK, an enabling signal, e.g., a positive voltage, is provided on first read word line RWL1, and an enabling signal is provided to turn on transistor 204 coupled to first bit line BL1. Thus, transistor 138 of memory cell $202_1$ and transistor 204 coupled to first bit line BL1 are turned on, and a voltage drop is applied across memory units $102_1$ and $102_2$ of memory cell $202_1$. Sense amplifier 140 detects the current through first bit line BL1, i.e., the current through memory units $102_1$ and $102_2$ of memory cell $202_1$ and compares the detected current with the three reference values, Ref1, Ref2, Ref3. Based on the result of the comparison, sense amplifier outputs two bits of data, D0 and D1, simultaneously. In FIG. 3A, the shaded areas of D0 and D1 are time periods during which data are transmitted, and the clear areas of D0 and D1 are time periods during which no data are transmitted or previous data are latched. Thus, each memory cell 202 is capable of outputting two bits of data during one clock cycle, and a bandwidth for reading MRAM device 200, or a read bandwidth of MRAM device 200, is doubled.

However, according to Hung et al., only one bit of datum may be written into each memory cell 202 in one clock cycle, and writing two bits of data into each memory cell 202 takes two clock cycles. As an example, FIG. 3B shows a sequence of signals on write word lines WWL1 and WWL2 and first bit line BL1 for writing data into memory cell $202_1$. Particularly, a bit of datum is written into memory unit $102_1$ of memory cell $202_1$ in a first clock cycle, by first providing a current through first write word line WWL1 and then providing a current in an appropriate direction through first bit line BL1. In a second clock cycle, a bit of datum is written into memory unit $102_2$ of memory cell $202_1$ by first providing a current through second write word line WWL2, and then providing a current in an appropriate direction through first bit line BL1. Because the current through first bit line BL1 defines states of both memory unit $102_1$ and memory unit $102_2$, the two bits of data must be separately written into memory units $102_1$ and $102_2$. Similarly, in FIG. 3B, the shaded areas of BL1 are time periods during which data are transmitted, and the clear areas of BL1 are time periods during which no data are transmitted.

Therefore, although the read bandwidth of MRAM device 200 is doubled by including two memory units connected in parallel in each memory cell 202, a bandwidth for writing MRAM device 200, i.e., a write bandwidth of MRAM device 200, is limited, because two clock cycles are required for writing each two-bit memory cell 202.

SUMMARY OF THE INVENTION

Consistent with embodiments of the present invention, there is provided a method for accessing a memory cell of a magnetoresistive random access memory (MRAM) device. The memory cell includes a plurality of memory units each for storing a bit of datum. The method includes writing the memory cell, where writing the memory cell includes identifying ones of the memory units, each of the ones of the memory units having stored therein a datum different from a datum to be written thereto; and simultaneously writing all of the ones of the memory units.

Consistent with embodiments of the present invention, there is also provided a method for accessing a memory cell of a magnetoresistive random access memory device, where the memory cell comprising a plurality of memory units each for storing a bit of datum. The method includes writing the memory cell by reading data stored in the memory units; identifying first ones of the memory units and second ones of the memory units, wherein each of the first ones of the memory units has stored therein a datum different from a datum to be written thereto and each of the second ones of the memory units has stored therein a datum the same as a datum to be written thereto; subjecting the first and second ones of the memory units to a first magnetic field in a first direction between a first time point and a second time point; subjecting the first ones of the memory units to a second magnetic field in a second direction between a third time point and a fourth time point, the first and second directions being substantially perpendicular to each other; and subjecting the second ones of the memory units to a third magnetic field in the second direction between the third time point and a fifth time point, wherein the first and second magnetic fields change a state of each of the first ones of the memory units, and the first and third magnetic fields maintain a state of each of the second ones of the memory units.

Consistent with embodiments of the present invention, there is also provided a method for operating a magnetoresistive random access memory (MRAM) device. The MRAM device includes a plurality of memory cells, each memory cell including a plurality of memory units. The method includes selecting first ones of the memory cells; and writing the first ones of the memory cells. Writing the first ones of the memory cells further includes reading data stored in the memory units of the first ones of the memory cells, identifying first ones of the memory units of the first ones of the memory cells and second ones of the memory units of the first ones of the memory cells, wherein each of the first ones of the memory units has stored therein a datum different from a datum to be written thereto and each of the second ones of the memory units has stored therein a datum the same as a datum to be written thereto, and simultaneously writing the first ones of the memory units.

Consistent with embodiments of the present invention, a magnetoresistive random access memory device includes a plurality of read bit lines; a plurality of write bit lines; a plurality of read word lines; a plurality of write word lines substantially perpendicular to the write bit lines; and a plurality of memory cells. Each memory cell corresponds to one of the read bit lines, one of the read word lines, one of the write word lines, and several of the write bit lines. Each memory cell includes a plurality of memory units each corresponding to one of the corresponding several write bit lines. Each memory unit includes a free magnetic region having one or more easy axes non-perpendicular to the write bit lines and non-perpendicular to the write word lines, a pinned magnetic region, and a tunneling barrier between the free magnetic region and the pinned magnetic region.

Additional features and advantages of the invention will be set forth in part in the description which follows, and in part will be apparent from that description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain features, advantages, and principles of the invention.

In the drawings,

FIGS. 7(a)-7(e) illustrate a process by which the sequence of signals shown in FIG. 6 write a memory unit of the MRAM device shown in FIG. 4A;

FIGS. 10(a)-10(e) illustrate states of a memory unit subjected to the sequence of signals shown in FIG. 9;

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Consistent with embodiments of the present invention, there are provided high-bandwidth MRAM devices having not only a high read bandwidth but also a high write bandwidth, and methods for operating the high-bandwidth MRAM devices.

Figure 1:
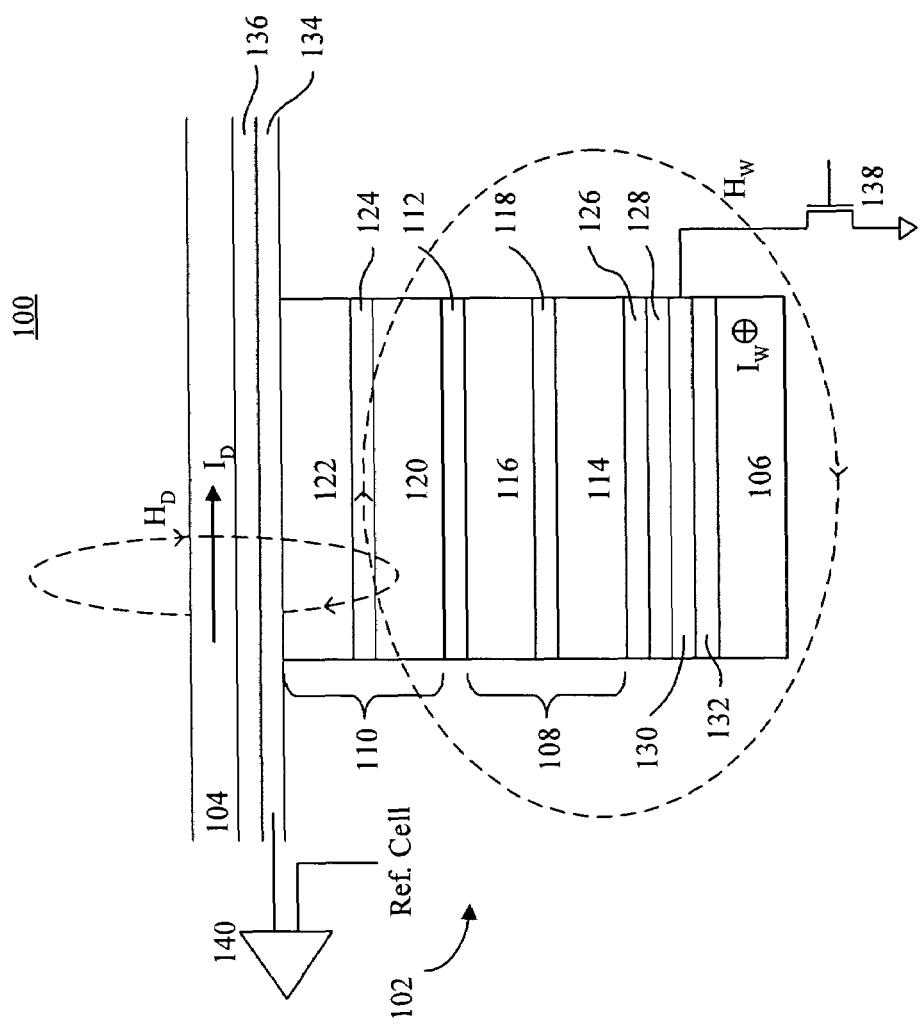
FIG. 1 shows a memory cell of a conventional MRAM device.
Figure 2:
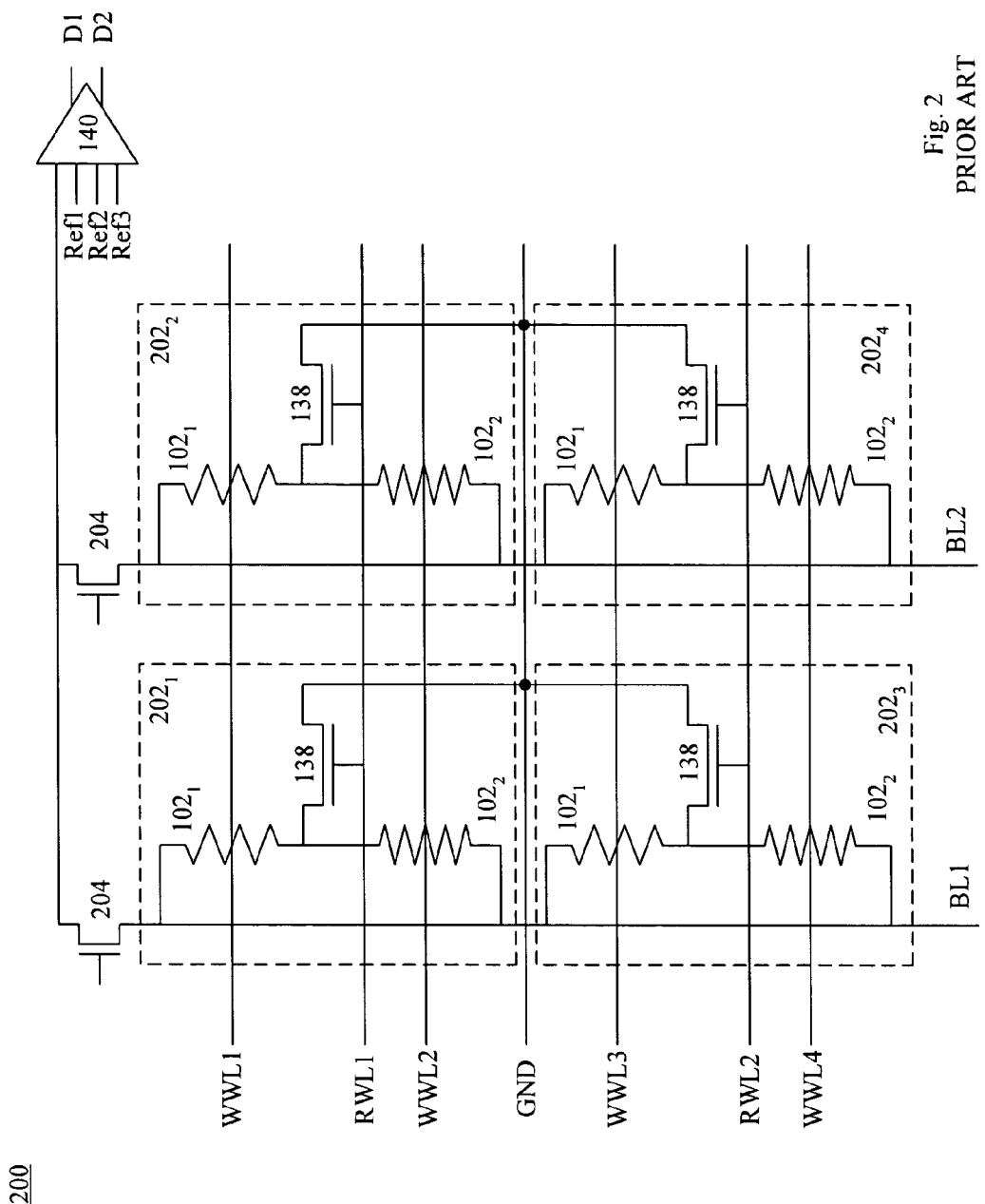
FIG. 2 shows a conventional high-density MRAM device.
Figure 3A:
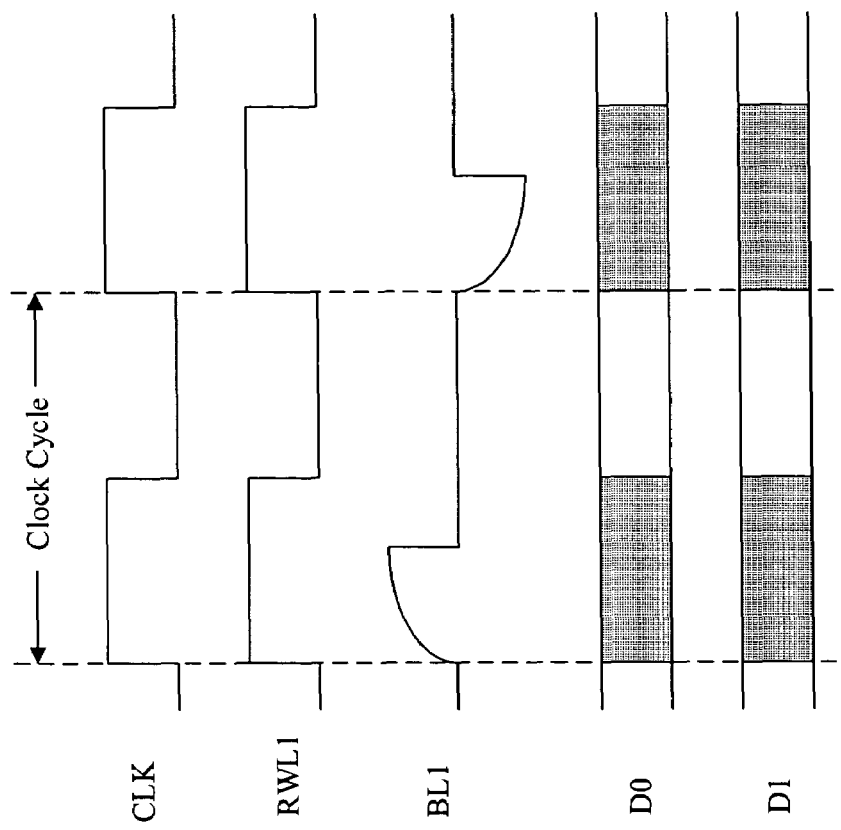
FIG. 3A shows a sequence of signals for reading a memory cell of the high-density MRAM device in FIG. 2.
Figure 3B:
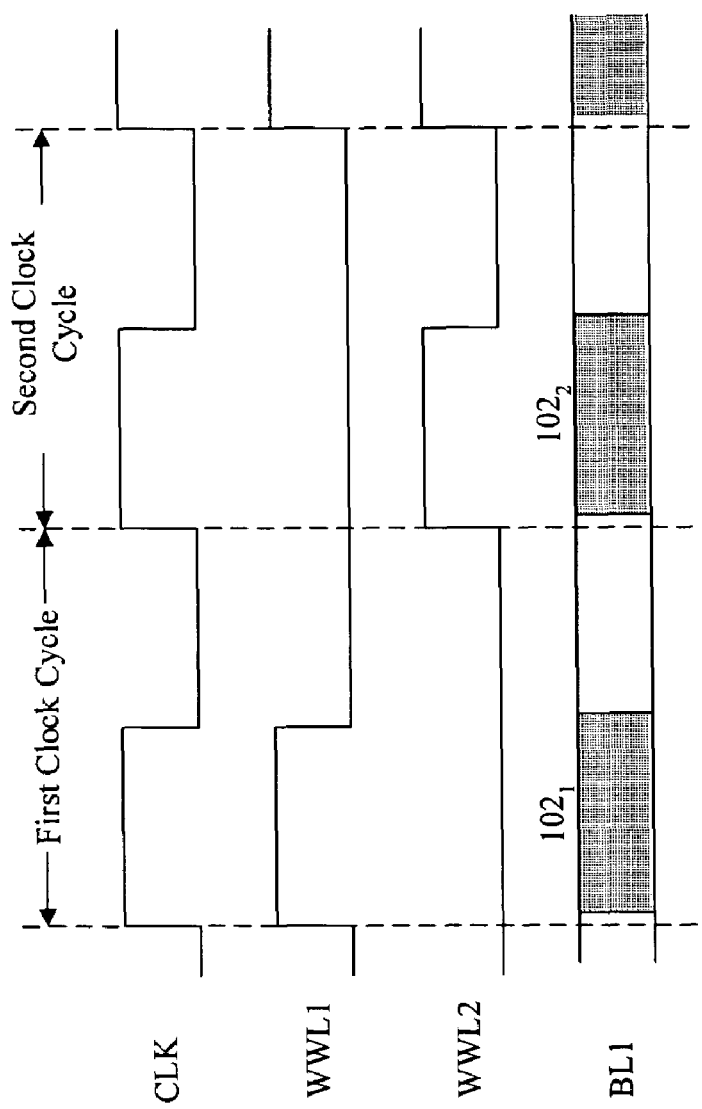
FIG. 3B shows a sequence of signals for writing a memory cell of the high-density MRAM device in FIG. 2.
Figure 4A:
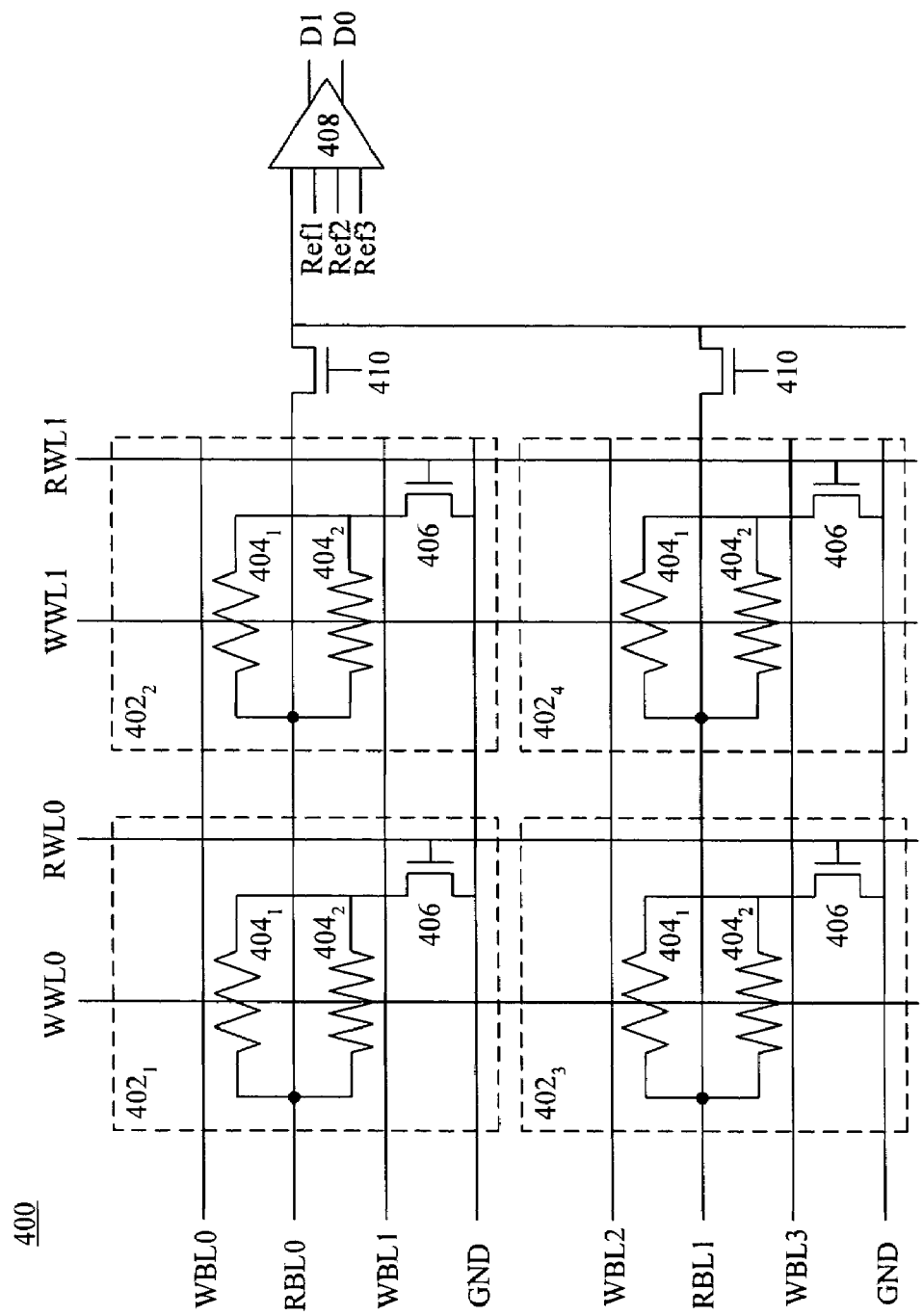
FIG. 4A shows an MRAM device consistent with a first embodiment of the present invention.

FIG. 4A shows an MRAM device 400 consistent with a first embodiment of the present invention. MRAM device 400 includes an array of memory cells 402, four of which, $402_1$, $402_2$, $402_3$, $402_4$ are shown. Each memory cell 402 corresponds to a read bit line RBL, a read word line RWL, a write word line WWL, and several, particularly two in FIG. 4A, write bit lines WBL. Each memory cell 402 includes two memory units 404 as memory units $404_1$ and $404_2$, connected in parallel between a transistor 406 and the corresponding read bit line RBL, where a gate of transistor 406 is connected to the corresponding read word line RWL. Each memory unit 404 corresponds to one of the write bit lines WBL. As FIG. 4A shows, memory cells $402_1$ and $402_2$ correspond to a first read bit line RBL0; memory units $404_1$ of memory cells $402_1$ and $402_2$ correspond to a first write bit line WBL0; and memory units $404_2$ of memory cells $402_1$ and $402_2$ correspond to a second write bit line WBL1. Memory cells $402_3$ and $402_4$ correspond to a second read bit line RBL1; memory units $404_1$ of memory cells $402_3$ and $402_4$ correspond to a third write bit line WBL2; and memory units $404_2$ of memory cells $402_3$ and $402_4$ correspond to a fourth write bit line WBL3. Memory cells $402_1$ and $402_3$ correspond to a first read word line RWL0 and a first write word line WWL0; and memory cells $402_2$ and $402_4$ correspond to a second read word line RWL1 and a second write word line WWL1. A sense amplifier 408 is coupled to each read bit line RBL through a select transistor 410 to detect a current through a selected memory cell 402.

Figure 4C:
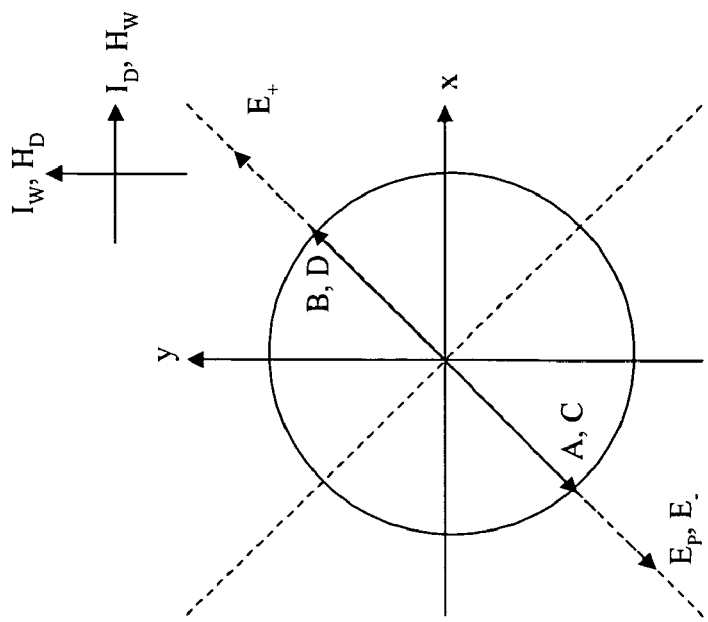
FIG. 4C is a plan view illustrating magnetic moments in a memory unit of the MRAM device shown in FIG. 4A.
Figure 4B:
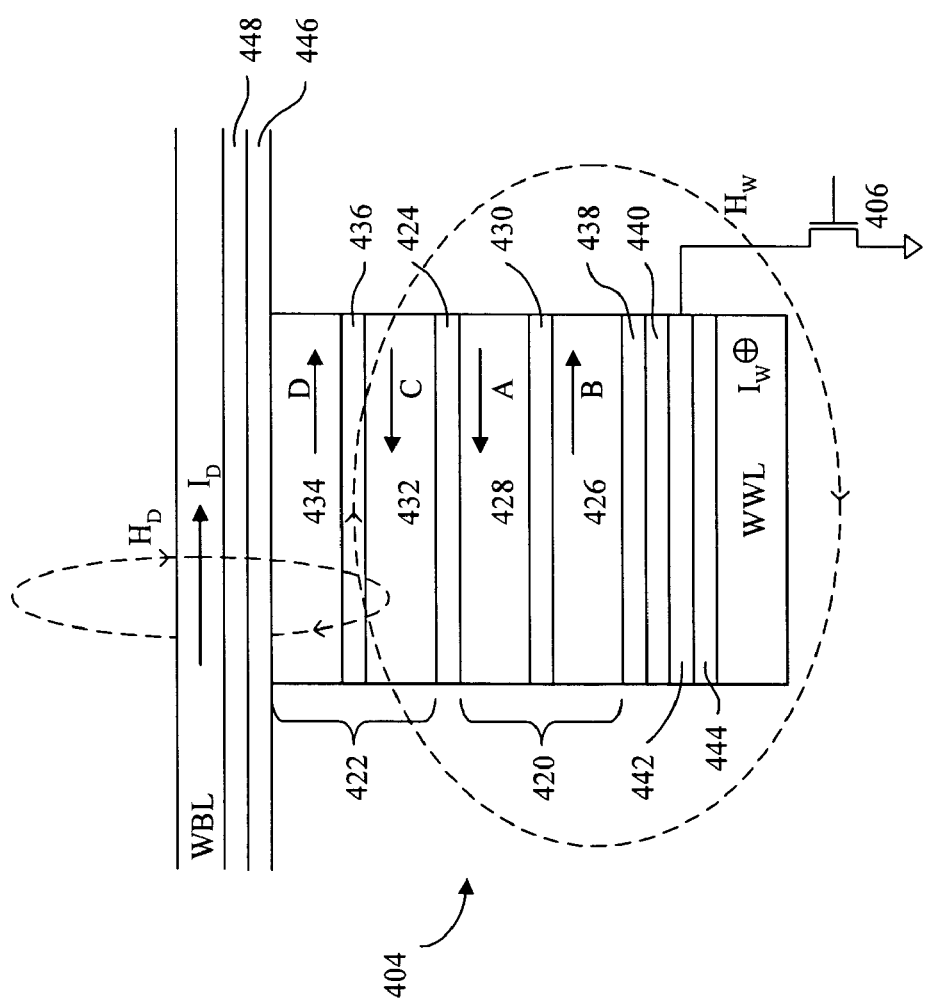
FIG. 4B shows a cross-sectional view of a memory unit of the MRAM device shown in FIG. 4A.

FIG. 4B shows a cross-sectional view of one memory unit 404. Memory unit 404 is formed between the corresponding write word line WWL and the corresponding write bit line WBL. It is assumed that write bit line WBL is above memory unit 404, write word line WWL is below memory unit 404, and write bit line WBL and write word line WWL are approximately perpendicular to each other. However, it is to be understood that the terms "above" and "below" are relative terms depending on an angle at which one views memory unit 404. Memory unit 404 includes a pinned magnetic region 420, a free magnetic region 422, and a tunneling barrier 424 sandwiched between pinned magnetic region 420 and free magnetic region 422. Tunneling barrier 424 may comprise, for example, aluminum oxide ($AlO_x$) or magnesium oxide (MgO).

Pinned magnetic region 420 may comprise a pinned ferromagnet or a synthetic anti-ferromagnetic (SAF) structure. FIG. 4B shows that pinned magnetic region 420 comprises a three-layered SAF structure including two ferromagnetic layers 426 and 428 sandwiching an anti-ferromagnetic coupling spacer layer 430. Ferromagnetic layers 426 and 428 may comprise, for example, cobalt-iron (CoFe), nickel-iron (NiFe), or cobalt-iron-boron (CoFeB). Anti-ferromagnetic coupling spacer layer 430 may comprise, for example, ruthenium (Ru) or copper (Cu). A thickness of anti-ferromagnetic coupling spacer layer 430 is selected such that ferromagnetic layers 426 and 428 are anti-ferromagnetically coupled to each other.

Free magnetic region 422 may comprise an SAF including two ferromagnetic layers 432 and 434 sandwiching an anti-ferromagnetic coupling spacer layer 436. Ferromagnetic layers 432 and 434 may comprise, for example, cobalt-iron (CoFe), cobalt-iron-boron (CoFeB), or nickel-iron (NiFe). Anti-ferromagnetic coupling spacer layer 436 may comprise, for example, ruthenium (Ru) or copper (Cu). A thickness of anti-ferromagnetic coupling spacer layer 436 is selected such that ferromagnetic layers 432 and 434 are anti-ferromagnetically coupled to each other. Although FIG. 4B only shows free magnetic region 422 to include three layers, a single free magnetic layer or a multi-layered SAF structure having more than three layers can also be used. For example, free magnetic region 422 may comprise three or more ferromagnetic layers separated by coupling spacer layers.

An anti-ferromagnetic pinning layer 438, a buffer layer 440, a bottom electrode 442, and a dielectric layer 444 are sequentially provided between pinned magnetic region 420 and write word line WWL. Anti-ferromagnetic pinning layer 438 may comprise, for example, platinum manganese (PtMn) or manganese iridium (MnIr). Buffer layer 440 may comprise, for example, nickel-iron (NiFe), nickel-iron-chromium (NiFeCr) or nickel-iron-cobalt (NiFeCo). A top electrode 446 is provided on free magnetic region 422 and a dielectric layer 448 is provided between top electrode 446 and the corresponding write bit line WBL.

Anti-ferromagnetic pinning layer 438 pins a magnetic moment of pinned magnetic region 420, such that the magnetic moment of pinned magnetic region 420 does not rotate when a moderate magnetic field is applied. In contrast, a magnetic moment of free magnetic region 422 is free to rotate under an external magnetic field.

Consistent with the first embodiment of the present invention, pinned magnetic region 420 has an easy axis $E_P$, and free magnetic region 422 has a positive easy axis $E_+$ and a negative easy axis $E_-$, where all of $E_P$, $E_+$, and $E_-$ are at an angle of about 45° with the corresponding write word line and write bit line, and $E_+$ and $E_-$ are anti-parallel with each other. FIG. 4C is a plan view illustrating magnetic moments in memory unit 404 with respect to the directions of the corresponding write bit line WBL and write word line WWL when memory unit 404 is viewed from the top. In FIG. 4C, an x-axis is along the direction of the corresponding write bit line WBL and a y-axis is along the direction of the corresponding write word line WWL. The positive x-axis is in the direction along write bit line WBL shown in FIG. 4B from left to right, and the positive y-axis is in the direction along write word line WWL shown in FIG. 4B from outside the paper into the plane of the paper. In the absence of external magnetic fields, magnetic moment vectors of ferromagnetic layers 426, 428, 432, and 434 align with one of the easy axes. In FIG. 4C, a magnetic moment vector A of ferromagnetic layer 428 is aligned with easy axis $E_P$, a magnetic moment vector B of ferromagnetic layer 426 is anti-parallel with magnetic moment vector A, a magnetic moment vector C of ferromagnetic layer 432 is aligned with negative easy axis $E_-$, and a magnetic moment vector D of ferromagnetic layer 434 is aligned with positive easy axis $E_+$. The arrowed lines labeled as magnetic moment vectors A-D in FIGS. 4B and 4C and in others figures herein only indicate the approximate directions of these magnetic moment vectors, and do not indicate the relative strengths thereof.

An electron tunneling barrier of tunneling barrier 424 and, therefore, a resistance of memory unit 404, change with magnetic fields. For example, when magnetic moment vector A of ferromagnetic layer 428 and magnetic moment vector C of ferromagnetic layer 432 are parallel to each other, tunneling barrier 424 has a low electron tunneling barrier and memory unit 404 has a low resistance. When magnetic moment vector A of ferromagnetic layer 428 and magnetic moment vector C of ferromagnetic layer 432 are anti-parallel to each other, tunneling barrier 424 has a high electron tunneling barrier and memory unit 404 has a high resistance. Thus, memory unit 404 may store one bit of "1" or "0" defined by the value of the resistance thereof. For example, a high resistance of memory unit 404 may represent a bit of "1" and a low resistance of memory unit 404 may represent a bit of "0", or the converse.

Figure 5:
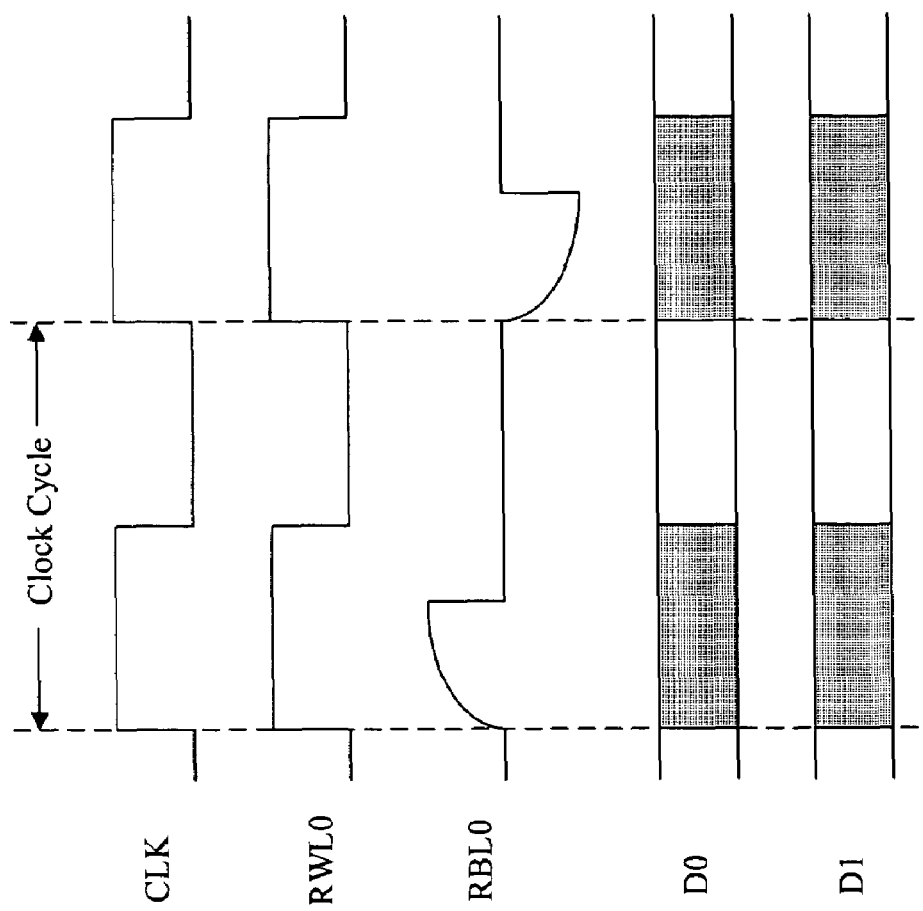
FIG. 5 shows a sequence of signals for reading a memory cell of the MRAM device shown in FIG. 4A.

Consistent with the first embodiment of the present invention, MRAM device 400 is manufactured such that a resistance of each of memory cells 402 has a different value corresponding to a different state of the corresponding memory cell 402. For example, memory cell $402_1$ has four possible states: 1) "00", when memory unit $404_1$ has stored therein a bit of "0", and memory unit $404_2$ has stored therein a bit of "0"; 2) "01", when memory unit $404_1$ has stored therein a bit of "0", and memory unit $404_2$ has stored therein a bit of "1"; 3) "10", when memory unit $404_1$ has stored therein a bit of "1", and memory unit $404_2$ has stored therein a bit of "0"; and 4) "11", when memory unit $404_1$ has stored therein a bit of "1", and memory unit $404_2$ has stored therein a bit of "1". Then memory cell $402_1$ also has four possible resistance values respectively corresponding to the four possible states thereof. In other words, $R_{1max}//R_{2max}$, $R_{1max}//R_{2min}$, $R_{1min}//R_{2max}$, $R_{1min}//R_{2min}$ all have different values, wherein $R_{1max}$ is the high resistance of each memory unit $404_1$, $R_{1min}$ is the low resistance of each memory unit $404_1$, $R_{2max}$ is the high resistance of each memory unit $404_2$, $R_{2min}$ is the low resistance of each memory unit $404_2$. Consequently, two bits of data may be read from a selected memory cell 402 in one clock cycle by determining the resistance of the selected memory cell 402. Consider memory cell $402_1$ as an example. FIG. 5 shows a clock signal CLK and a sequence of signals on read word line RWL0 and read bit line RBL0 for reading memory cell $402_1$. On a rising edge of clock signal CLK, an enabling signal, e.g., a positive voltage, is provided on read word line RWL0, thereby turning on transistors 406 coupled to read word line RWL0, and an enabling signal (not shown) is provided to turn on select transistor 410 coupled to read bit line RBL0 to activate read bit line RBL0. A voltage drop between read bit line RBL0 and transistor 406 is therefore applied across memory units $404_1$ and $404_2$ of memory cell $402_1$, and sense amplifier 408 detects a current through read bit line RBL0, i.e., the current through memory units $404_1$ and $404_2$ of memory cell $402_1$. Sense amplifier 408 compares the detected current with three intermediate reference current values Ref1, Ref2, Ref3, which correspond to reference resistance values, R1, R2, R3, between $R_{1max}//R_{2max}$, $R_{1max}//R_{2min}$, $R_{1min}//R_{2max}$, $R_{1min}//R_{2min}$. Assume, for example, $R_{1max}//R_{2max}>R1>R_{1max}//R_{2min}>R2>R_{1min}//R_{2max}>R3>R_{1min}//R_{2min}$. Thus, if the detected current is between Ref1 and Ref2, then the resistance of memory cell $402_1$ is $R_{1max}//R_{2min}$. Consequently, memory unit $404_1$ of memory cell $402_1$ has a bit of "1" stored therein, and memory unit $404_2$ of memory cell $402_1$ has a bit of "0" stored therein. Thus, two bits of data may be read out each memory cell 402 during one clock cycle. In FIG. 5 and subsequent drawing figures showing sequence of signals, shaded areas indicate time periods during which data are transmitted, clear areas indicate time periods during which no data are transmitted or previous data are latched, and different types of shadings indicate separate bits of data that may or may not be different from one another.

MRAM device 400 consistent with the first embodiment of the present invention also has a high write bandwidth. Particularly, two bits of data may be written into a selected memory cell 402 during one clock cycle. Consistent with a second embodiment of the present invention, a so-called toggle writing method is applied to write two bits of data into a selected memory cell 402 of MRAM device 400. According to the toggle writing method, a bit of datum to be written into a memory unit is first compared with the datum stored in the memory unit. If the datum to be written is the same as the datum stored in the memory unit, no writing operation is performed. Otherwise, the state of the memory unit is changed, or "toggled". If necessary, both memory units $404_1$ and $404_2$ of a selected memory cell 402 may be toggled at the same time. The second embodiment is described with reference to FIGS. 6 and 7(a)-7(e). It is assumed that memory cell $402_1$ is selected for the writing operation.

To toggle write one of memory units 404, write currents are provided to the corresponding write word line WWL and write bit line WBL to induce external magnetic fields, thereby changing the magnetic moment of ferromagnetic layer 432 thereof. FIGS. 4B and 4C show the relationship between currents provided to write bit line WBL and write word line WWL and the external magnetic fields induced thereby. A word current $I_W$ through write word line WWL induces a circular word magnetic field $H_W$, and a digit current $I_D$ through write bit line WBL induces a circular digit magnetic field $H_D$. The strength of magnetic fields $H_W$ and $H_D$ are respectively proportional to word current $I_W$ and digit current $I_D$. Also, as shown in FIG. 4B, when word current $I_W$ is positive, i.e., in the positive y-axis direction, $H_W$ is substantially in the positive x-axis direction in the plane of memory unit 404; when digit current $I_D$ is positive, i.e., in the positive x-axis direction, $H_D$ is substantially in the positive y-axis direction in the plane of memory unit 404.

Figure 6:
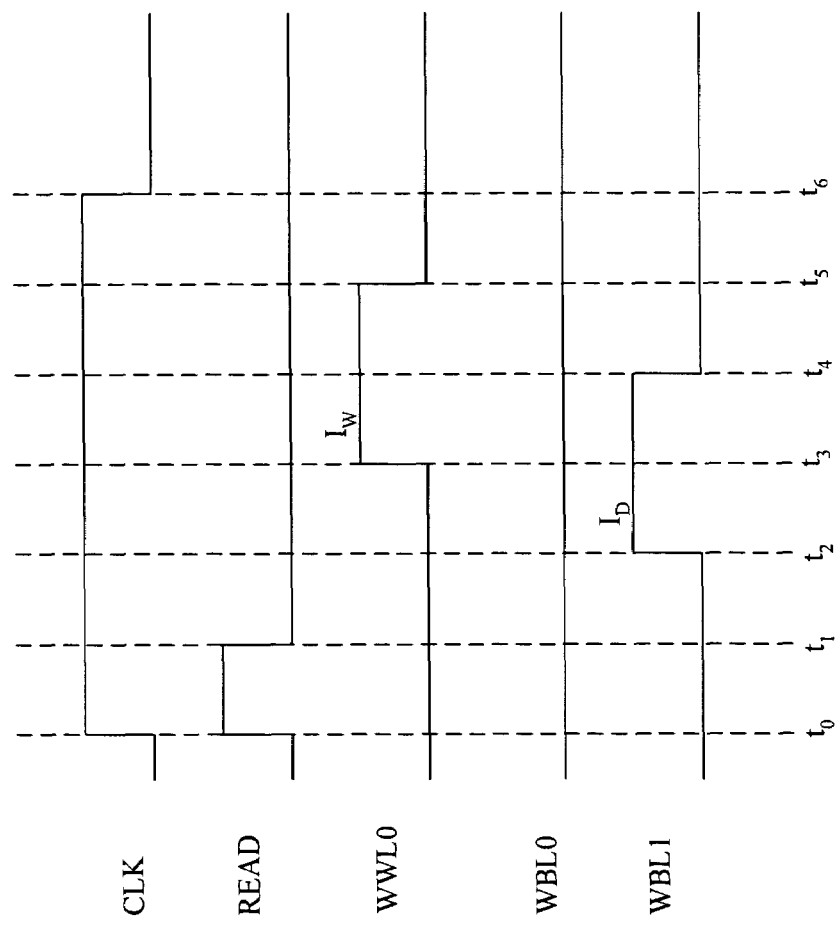
FIG. 6 shows, consistent with a second embodiment of the present invention, a sequence of signals for writing a memory cell of the MRAM device shown in FIG. 4A.

FIG. 6 shows a sequence of signals on write word line WWL0, write bit line WBL0, and write bit line WBL1, provided by a peripheral circuit (not shown), hereinafter referred to as the writing circuit, for writing data into memory cell $402_1$. As FIG. 6 shows, clock signal CLK rises at time $t_0$. Between time $t_0$ and time $t_1$, a logic circuit (not shown) reads memory cell $402_1$, compares the data in memory cell $402_1$ with the data to be written into memory cell $402_1$, and determines if one or both of memory units $404_1$ and $404_2$ should be toggled. It is assumed that memory unit $404_1$ has stored therein a bit of datum the same as the bit of datum to be written thereto, and that memory unit $404_2$ has stored therein a bit of datum different from the bit of datum to be written thereto. Therefore, memory unit $404_2$ should be toggled, while memory unit $404_1$ should not.

Then, the writing circuit sequentially provides a digit current and a word current to toggle memory unit $404_2$. Particularly, at time $t_2$, a positive digit current $I_D$ is provided through write bit line WBL1; at time $t_3$, a positive word current $I_W$ is provided through write word line WWL0; at time $t_4$, $I_D$ is turned off; and at time $t_5$, $I_W$ is turned off. Clock signal CLK falls at time $t_6$. Through the time period of to $t_6$, no current is provided through write bit line WBL0.

As a result of the word current and bit current provided as shown in FIG. 6, memory unit $404_2$ is toggled, and the state of memory unit $404_1$ remains unchanged. FIGS. 7(a)-7(e) illustrate the process by which $I_D$ and $I_W$ shown in FIG. 6 toggle write memory unit $404_2$-Magnetic moment vectors C and D in the following descriptions of FIGS. 7(a)-7(e) refer to magnetic moment vectors C and D of memory unit $404_2$.

FIG. 7(a) shows magnetic moment vector C of ferromagnetic layer 432 and magnetic moment vector D of ferromagnetic layer 434 at times $t_0$ and $t_1$, when no word current or digit current is provided. Magnetic moment vector C is in the direction of negative easy axis $E_-$ of free magnetic region 422 and magnetic moment vector D is in the direction of positive easy axis $E_+$ of free magnetic region 422.

FIG. 7(b) shows magnetic moment vectors C and D at time $t_2$, when $I_D$ is provided, inducing a digit magnetic field $H_D$ substantially in the positive y-axis direction. Under digit magnetic field $H_D$, magnetic moment vectors C and D rotate clockwise. Magnetic moment vector C is in a direction between the negative x-axis and the positive y-axis. Magnetic moment vector D is in a direction between the positive x-axis and positive easy axis $E_+$ of free magnetic region 422.

FIG. 7(c) shows magnetic moment vectors C and D at time $t_3$, when $I_W$ is provided, inducing a word magnetic field $H_W$ substantially in the positive x-axis direction. As a result, magnetic moment vectors C and D further rotate clockwise. Magnetic moment vector C approaches the positive y-axis, and magnetic moment vector D may pass the positive x-axis.

FIG. 7(d) shows magnetic moment vectors C and D at time $t_4$, when $I_D$ is turned off. As a result, magnetic moment vectors C and D further rotate clockwise. Magnetic moment vector C may pass the positive y-axis and approaches positive easy axis $E_+$ of free magnetic region 422. Magnetic moment vector D approaches the negative x-axis.

FIG. 7(e) shows magnetic moment vectors C and D at time $t_5$, when $I_W$ is also turned off. Because magnetic moment vector C is closer to positive easy axis $E_+$ than negative easy axis $E_-$ of free magnetic region 422, magnetic moment vector C further rotates clockwise and aligns with positive easy axis $E_+$ of free magnetic region 422. Because magnetic moment vector D is closer to negative easy axis $E_-$ than positive easy axis $E_+$ of free magnetic region 422, magnetic moment vector D further rotates clockwise and aligns with negative easy axis $E_-$ of free magnetic region 422.

Thus, after the sequence of $I_D$ and $I_W$ shown in FIG. 6, magnetic moment vector C of ferromagnetic layer 432 and magnetic moment vector D of ferromagnetic layer 434 have switched positions. Particularly, magnetic moment vector C of ferromagnetic layer 432 has rotated 180°. Thus, if memory unit $404_2$ previously had a bit of "0" stored therein, then the sequence of $I_D$ and $I_W$ shown in FIG. 6 has written a bit of "1" into memory unit $404_2$; if memory unit $404_2$ previously had a bit of "1" stored therein, then the sequence of $I_D$ and $I_W$ shown in FIG. 6 has written a bit of "0" into memory unit $404_2$.

Figure 8:
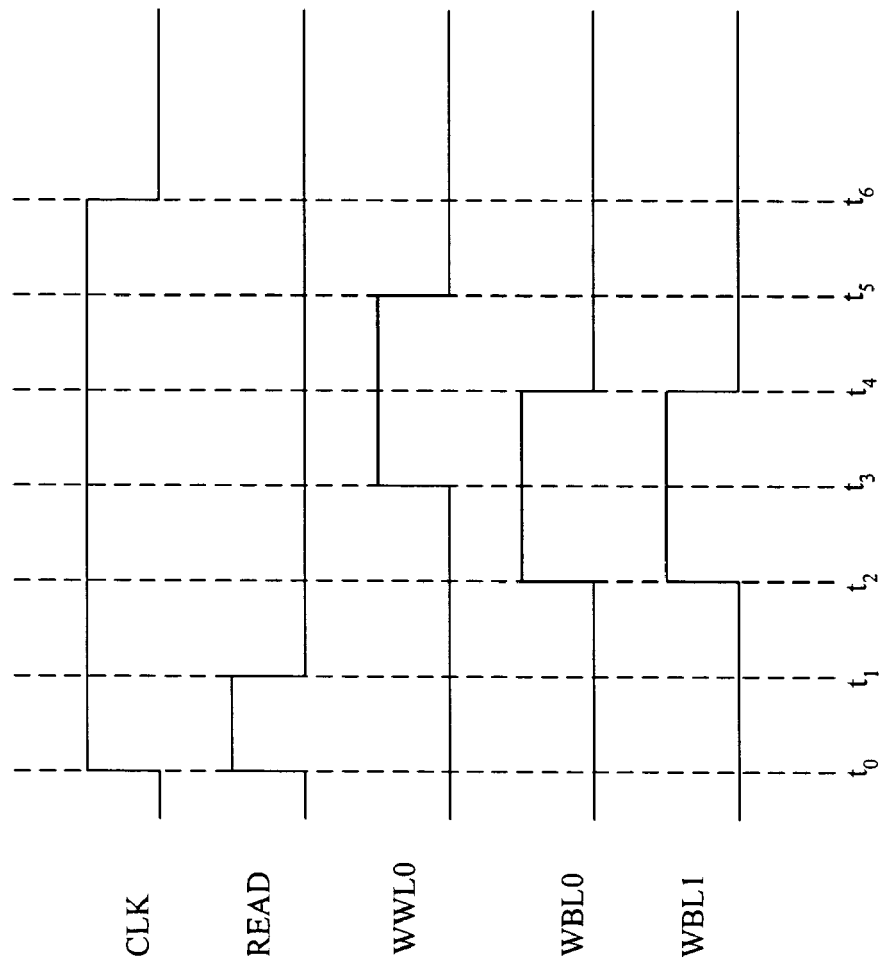
FIG. 8 shows a sequence of signals for writing multiple memory units of a memory cell of the MRAM device shown in FIG. 4A.

Similarly, when both memory units $404_1$ and $404_2$ need to be toggled, digit currents are provided through write bit lines WBL of both memory units $404_1$ and $404_2$ simultaneously to write the memory units $404_1$ and $404_2$ at the same time. FIG. 8 shows a sequence of signals on write word line WWL0, write bit line WBL0, and write bit line WBL1, for toggle writing both memory unit $404_1$ and memory unit $404_2$. The process of toggle writing both memory units $404_1$ and $404_2$ should now be apparent to one of ordinary skill in the art and is therefore not described in detail herein.

Thus, consistent with embodiments of the present invention, two bits of data may be read from or written into a selected memory cell 402 of MRAM device 400 within one clock cycle. In other words, MRAM device 400 not only has a high read bandwidth but also has a high write bandwidth.

Figure 9:
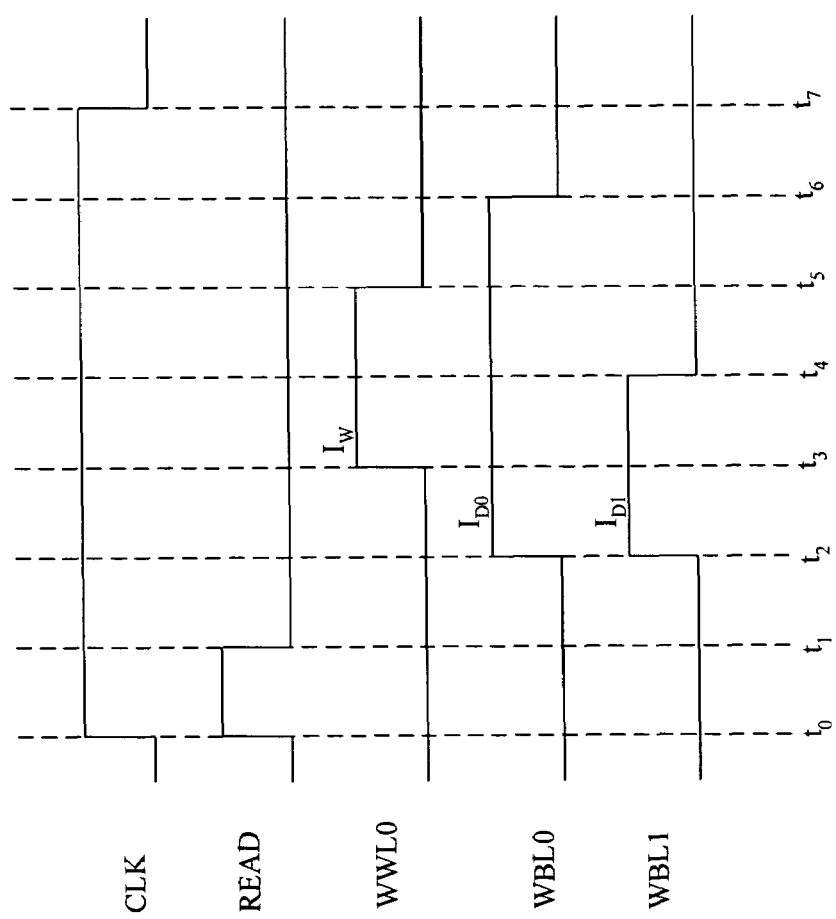
FIG. 9 shows a sequence of signals for writing a memory unit of the MRAM device shown in FIG. 4A.

In FIG. 6, a digit current $I_D$ is only provided to memory unit $404_2$, which is to be toggled. However, consistent with the second embodiment of the present invention, a digit current may also be provided to a memory unit 404 not to be toggled. FIG. 9 shows a sequence of signals on write word line WWL0, write bit line WBL0, and write bit line WBL1, for toggle writing only memory unit $404_2$. Particularly, at time $t_2$, a positive digit current $I_{D0}$ and a positive digit current $I_{D1}$ are respectively provided through write bit lines WBL0 and WBL1; at time $t_3$, a positive word current $I_W$ is provided through write word line WWL0; at time $t_4$, $I_{D1}$ is turned off; at time $t_5$, $I_W$ is turned off; and at time $t_6$, $I_{D0}$ is also turned off. Clock signal CLK falls at time $t_7$.

As compared to the sequence of signals shown in FIG. 6, when the sequence of signals shown in FIG. 9 are applied, memory unit $404_2$ is subjected to the same signals and will be toggled. However, memory unit $404_1$ is subjected to a different signal sequence and will not toggle. FIGS. 10(a)-10(e) illustrate the state of memory unit $404_1$ through the signal sequence shown in FIG. 9. Magnetic moment vectors C and D in the following descriptions of FIGS. 10(a)-10(e) refer to magnetic moment vectors C and D of memory unit $404_1$.

FIG. 10(a) shows magnetic moment vector C of ferromagnetic layer 432 and magnetic moment vector D of ferromagnetic layer 434 at times $t_0$ and $t_1$, when no word current or digit current is provided. Magnetic moment vector C is in the direction of negative easy axis $E_-$ of free magnetic region 422 and magnetic moment vector D is in the direction of positive easy axis $E_+$ of free magnetic region 422.

FIG. 10(b) shows magnetic moment vectors C and D at time $t_2$, when $I_{D0}$ is provided, inducing a digit magnetic field $H_{D0}$ substantially in the positive y-axis direction. Under digit magnetic field $H_{D0}$, magnetic moment vectors C and D rotate clockwise. Magnetic moment vector C is in a direction between the negative x-axis and the positive y-axis. Magnetic moment vector D is in a direction between the positive x-axis ad the positive easy axis $E_+$ of free magnetic region 422.

FIG. 10(c) shows magnetic moment vectors C and D at time $t_3$, when $I_W$ is provided, inducing a word magnetic field $H_W$ substantially in the positive x-axis direction. As a result, magnetic moment vectors C and D further rotate clockwise. Magnetic moment vector C approaches the positive y-axis, and magnetic moment vector D may pass the positive x-axis.

FIG. 10(d) shows magnetic moment vectors C and D at time $t_4$, when $I_W$ is turned off. As a result, magnetic moment vectors C and D rotate counterclockwise and return to the same positions as shown in FIG. 10(b).

FIG. 10(e) shows magnetic moment vectors C and D at time $t_5$, when $I_{D0}$ is also turned off. Magnetic moment vectors C and D further rotate counterclockwise and return to the same positions as shown in FIG. 10(a).

Thus, after the sequence of $I_{D0}$ and $I_W$ shown in FIG. 9, magnetic moment vector C of ferromagnetic layer 432 and magnetic moment vector D of ferromagnetic layer 434 of memory unit $404_1$ remain at the same positions, and a state of memory unit $404_1$ has not changed.

Figure 11:
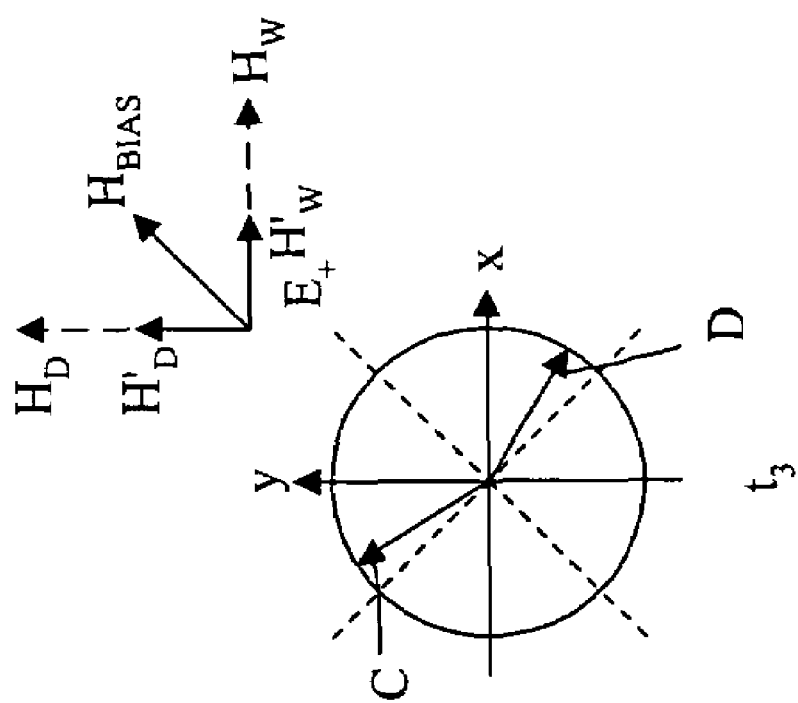
FIG. 11 illustrates the effect of a bias magnetic field on magnetic fields for writing a memory unit of the MRAM device shown in FIG. 4A.

Consistent with embodiments of the present invention, magnetic moment vector A of ferromagnetic layer 428 and magnetic moment vector B of ferromagnetic layer 426 may be adjusted to generate a fringe (or stray) magnetic field as a bias magnetic field $H_{BIAS}$ in free magnetic region 422, such that only weak magnetic fields $H_W$ and $H_D$ are required to toggle write memory unit 404. FIG. 11 shows the requisite magnetic fields $H_W$ and $H_D$ for toggle writing memory unit 404 when there is no bias magnetic field $H_{BIAS}$ and the requisite magnetic fields $H'_W$ and $H'_D$ for toggle writing memory unit 404 when there is bias magnetic field $H_{BIAS}$ in the direction of positive easy axis $E_+$ of free magnetic region 422. When weaker magnetic fields $H_W$ and $H_D$ are required for writing memory unit 404, lower word current $I_W$ and lower digit current $I_D$ may be applied. Thus, a bias magnetic field $H_{BIAS}$ results in a reduced power consumption.

Figure 12:
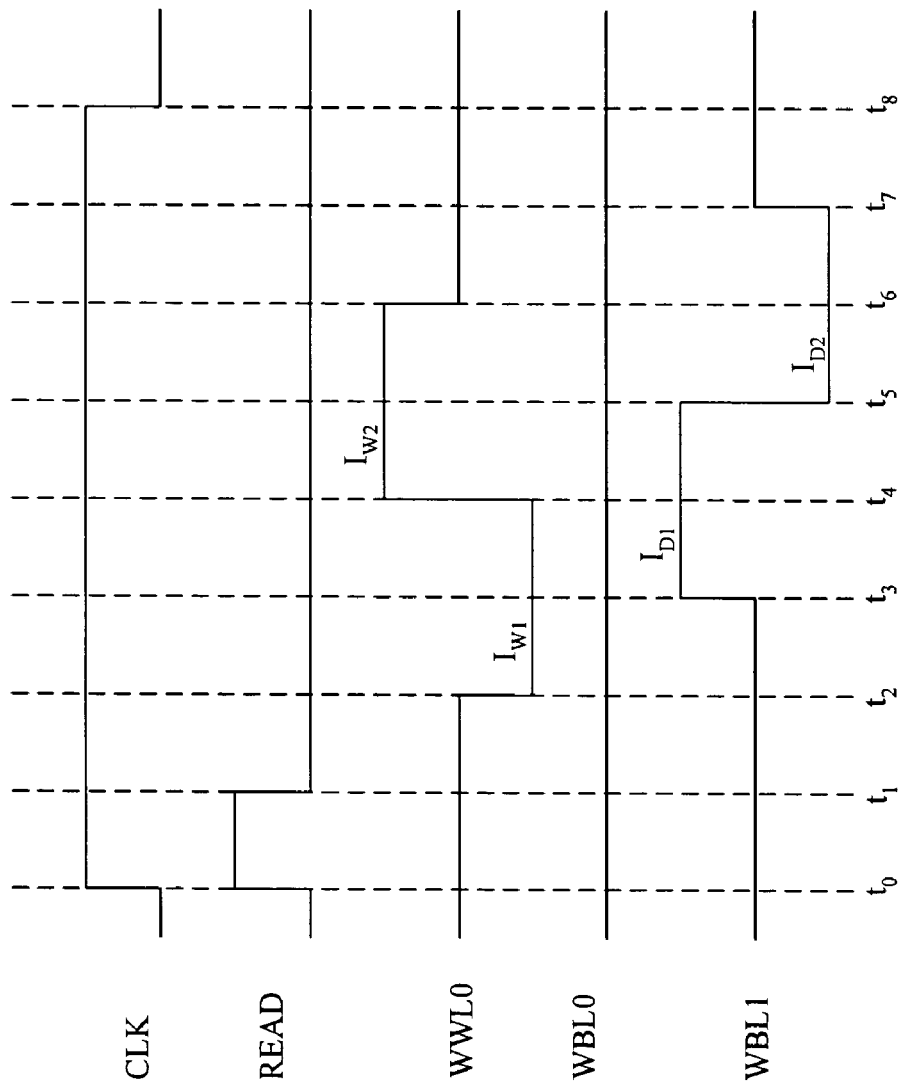
FIG. 12 shows, consistent with a third embodiment of the present invention, a sequence of signals for writing a memory cell of the MRAM device shown in FIG. 4A when the MRAM device is under a bias magnetic field.

Consistent with a third embodiment of the present invention, there is provided a method for operating MRAM device 400 when memory units 404 of MRAM device 400 are subjected to a bias magnetic field. The same sequence of signals as illustrated in FIG. 5 may be applied to read MRAM device 400. However, to write MRAM device 400, a sequence of writing currents with two bidirectional current pulses, i.e., current pulses with both a negative part and a positive part, are applied to toggle write memory cells 402 when memory cells 402 are under a bias magnetic field. For example, FIG. 12 shows a sequence of signals on write word line WWL0, write bit line WBL0, and write bit line WBL1, for writing data into memory cell $402_1$, when memory units $404_1$ and $404_2$ of memory cell $402_1$ are under a bias magnetic field $H_{BIAS}$ in the direction of positive easy axis $E_+$ of free magnetic region 422. As FIG. 12 shows, clock signal CLK rises at time $t_0$. Between time $t_0$ and time $t_1$, the logic circuit (not shown) reads memory cell $402_1$, compares the data in memory cell $402_1$ with the data to be written into memory cell $402_1$, and determines if one or both of memory units $404_1$ and $404_2$ should be toggled. It is assumed that the bit of datum to be written into memory unit $404_1$ is the same as the bit of datum stored in memory unit $404_1$, and that the bit of datum to be written into memory unit $404_2$ is different from the bit of datum stored in memory unit $404_2$. Therefore, memory unit $404_2$ is toggled, while memory unit $404_1$ is not.

Then, at time $t_2$, a negative word current $I_{W1}$ is provided through write word line WWL0; at time $t_3$, a positive digit current $I_{D1}$ is provided through write bit line WBL1; at time $t_4$, $I_{W1}$ is turned off, and a positive word current $I_{W2}$ is provided through write word line WWL0; at time $t_5$, $I_{D1}$ is turned off, and a negative digit current $I_{D2}$ is provided through write bit line WBL1; at time $t_6$, $I_{W2}$ is turned off; and at time $t_7$, $I_{D2}$ is also turned off. Clock signal CLK falls at time $t_8$. Through the time period of $t_0$ to $t_8$, no current is provided through write bit line WBL0.

FIGS. 13(a)-13(g) illustrate the process by which $I_{W1}$, $I_{D1}$, $I_{W2}$, and $I_{D2}$ shown in FIG. 12 toggle write memory unit $404_2$. Magnetic moment vectors C and D in the following descriptions of FIGS. 13(a)-13(g) refer to magnetic moment vectors C and D of memory unit $404_2$.

FIG. 13(a) shows magnetic moment vector C of ferromagnetic layer 432 and magnetic moment vector D of ferromagnetic layer 434 at times $t_0$ and $t_1$, when no word current or digit current is provided. Because of $H_{BIAS}$, magnetic moment vectors C and D, may rotate counterclockwise and respectively approach or pass the negative and positive y-axis.

As FIG. 13(b) shows, at time $t_2$, negative word current $I_{W1}$ is provided, generating a word magnetic field $H_{W1}$ substantially in the negative x-axis direction, i.e., at an angle of 135° with $H_{BIAS}$. In other words, $H_{W1}$ partially offsets $H_{BIAS}$. As a result, magnetic moment vectors C and D respectively approach easy axes $E_-$ and $E_+$.

FIG. 13(c) shows magnetic moment vectors C and D at time $t_3$, when $I_{D1}$ is provided, inducing a digit magnetic field $H_{D1}$ substantially in the positive y-axis direction. As a result, magnetic moment vectors C and D rotate clockwise. Magnetic moment vector C may pass the negative x-axis, and magnetic moment vector D approaches the positive x-axis.

FIG. 13(d) shows magnetic moment vectors C and D at time $t_4$, when $I_{W1}$ is turned off and $I_{W2}$ is turned on, inducing a word magnetic field $H_{W2}$ substantially in the positive x-axis direction. As a result, magnetic moment vectors C and D further rotate clockwise. Magnetic moment vector C approaches the positive y-axis and magnetic moment vector D may pass the positive x-axis.

FIG. 13(e) shows magnetic moment vectors C and D at time $t_5$, when $I_{D1}$ is turned off and $I_{D2}$ is turned on, inducing a digit magnetic field $H_{D2}$ in the negative y-axis. Magnetic moment vectors C and D further rotate clockwise. Magnetic moment vector C may pass the positive y-axis, and magnetic moment vector D approaches the negative y-axis.

FIG. 13(f) shows magnetic moment vectors C and D at time $t_6$, when $I_{W2}$ is turned off. Magnetic moment vectors C and D further rotate clockwise. Now magnetic moment vector C approaches positive easy axis $E_+$ and magnetic moment vector D may pass the negative y-axis and approaches negative easy axis $E_-$.

FIG. 13(g) shows magnetic moment vectors C and D at time $t_7$, when $I_{D2}$ is turned off. Because magnetic moment vector C is closer to positive easy axis $E_+$ direction and magnetic moment vector D is closer to negative easy axis $E_-$ direction prior to time $t_7$, magnetic moment vector C settles in a position close to positive easy axis $E_+$ direction and magnetic moment vector D settles in a position close to negative easy axis $E_-$ direction.

Thus, after the sequence of the word current and digit current shown in FIG. 12, magnetic moment vector C of ferromagnetic layer 432 and magnetic moment vector D of ferromagnetic layer 434 have changed positions. Particularly, magnetic moment vector C of ferromagnetic layer 432 has rotated from a position close to negative easy axis $E_-$ to a position close to positive easy axis $E_+$. Thus, if memory unit $404_2$ previously had a bit of "0" stored therein, then the sequence of the word current and digit current shown in FIG. 12 has written a bit of "1" into memory unit $404_2$; if memory unit $404_2$ previously had a bit of "1" stored therein, then the sequence of the word current and digit current shown in FIG. 12 has written a bit of "0" into memory unit $404_2$.

Figure 14:
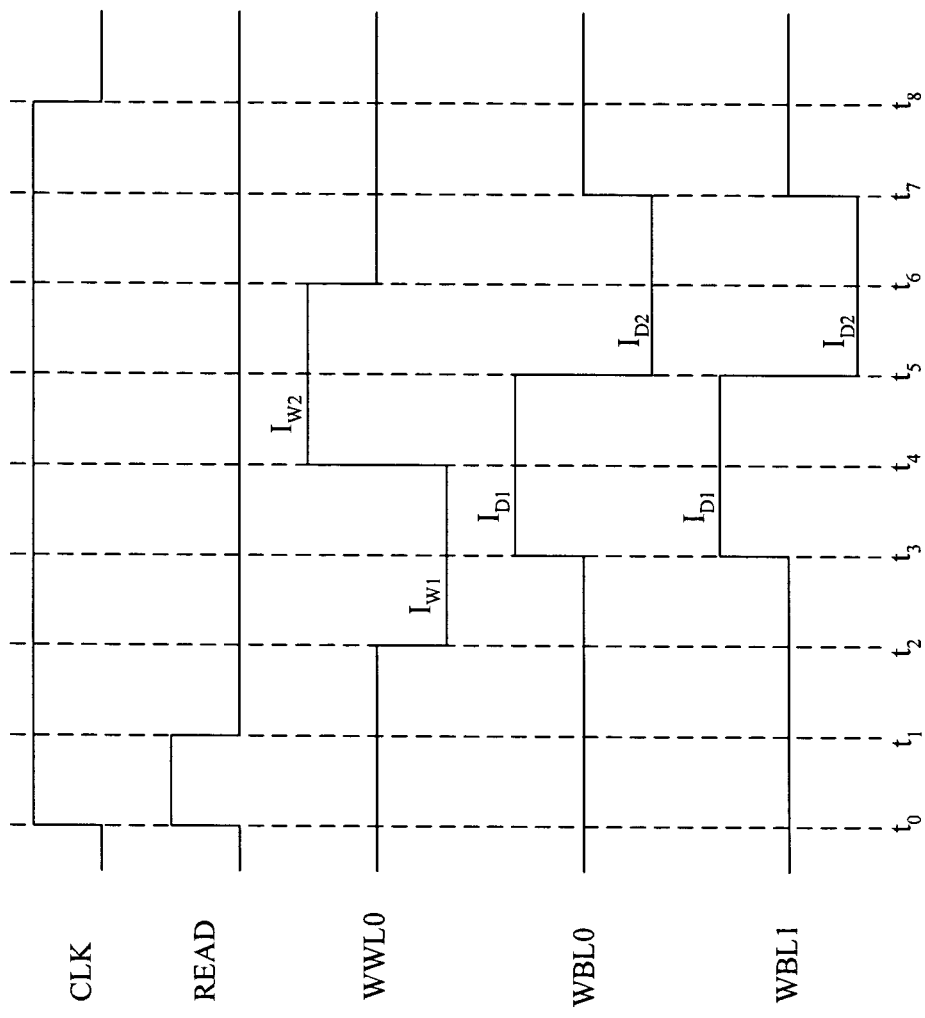
FIG. 14 shows a sequence of signals for writing multiple memory units of the MRAM device shown in FIG. 4A.

Similarly, when both memory units $404_1$ and $404_2$ need to be toggled, digit currents are simultaneously provided through write bit lines WBL of both memory units $404_1$ and $404_2$ to write the memory units $404_1$ and $404_2$ at the same time. FIG. 14 shows a sequence of signals on write word line WWL0, write bit line WBL0, and write bit line WBL1, for toggle writing both memory unit $404_1$ and memory unit $404_2$.

The process of toggle writing both memory units $404_1$ and $404_2$ should now be apparent to one of ordinary skill in the art and is therefore not described in detail herein.

Figure 15:
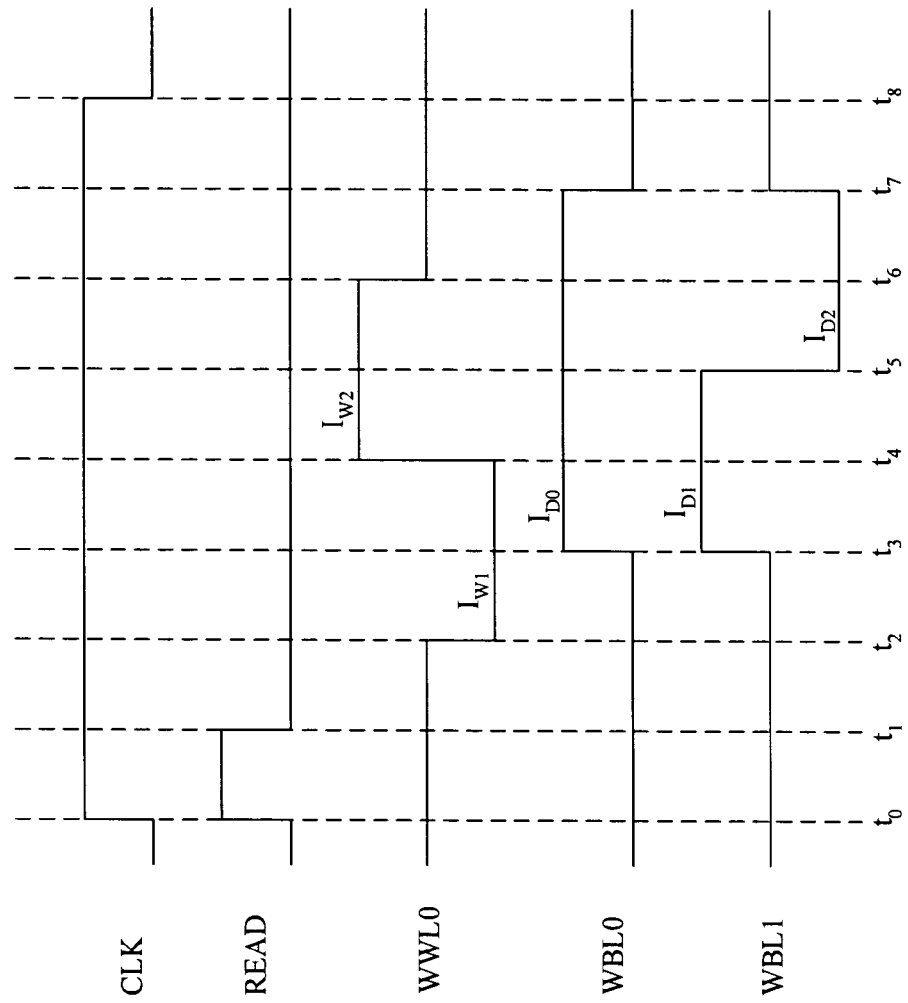
FIG. 15 shows, also consistent with the third embodiment of the present invention, a sequence of signals for writing a memory unit of the MRAM device shown in FIG. 4A.

In FIG. 12, digit currents $I_{D1}$ and $I_{D2}$ are only provided to memory unit $404_2$, which is to be toggled. However, consistent with the third embodiment of the present invention, a digit current may also be provided to a memory unit 404 not to be toggled. FIG. 15 shows a sequence of signals on write word line WWL0, write bit line WBL0, and write bit line WBL1, for toggle writing only memory unit $404_2$. Particularly, at time $t_2$, a negative word current $I_{W1}$ is provided through write word line WWL0; at time $t_3$, a positive digit current $I_{D0}$ and a positive digit current $I_{D1}$ are respectively provided through write bit line WBL0 and write bit line WBL1; at time $t_4$, $I_{W1}$ is turned off, and a positive word current $I_{W2}$ is provided through write word line WWL0; at time $t_5$, $I_{D1}$ is turned off, and a negative digit current $I_{D2}$ is provided through write bit line WBL1; at time $t_6$, $I_{W2}$ is turned off; and at time $t_7$, $I_{D0}$ and $I_{D2}$ are both also turned off. Clock signal CLK falls at time $t_8$.

Figure 13:
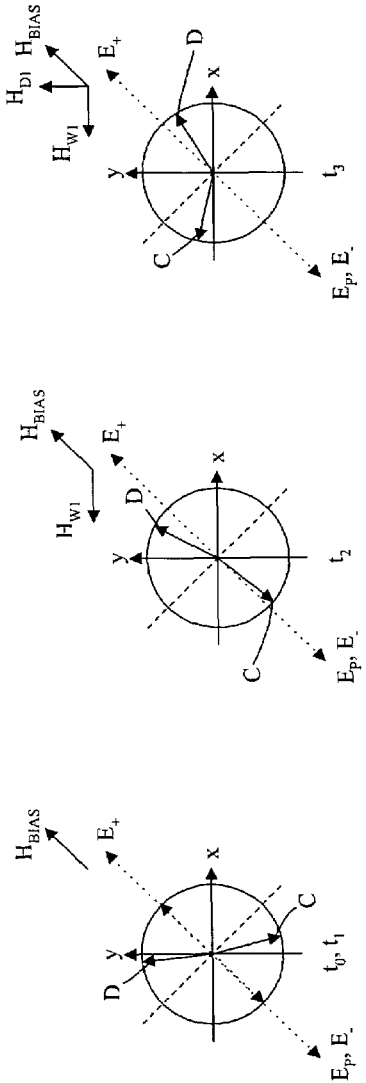
FIGS. 13(a)-13(g) illustrate a process by which the sequence of signals shown in FIG. 12 write a memory unit of the MRAM device shown in FIG. 4A.

As compared to the sequence of signals shown in FIG. 13, when the sequence of signals shown in FIG. 15 are applied, memory unit $404_2$ is subjected to the same signals and will toggle. However, memory unit $404_1$ is subjected to a different signal sequence and will not toggle. FIGS. 16(a)-16(e) illustrate the state of memory unit $404_1$ through the signal sequence shown in FIG. 15. Magnetic moment vectors C and D in the following descriptions of FIGS. 16(a)-16(e) refer to magnetic moment vectors C and D of memory unit $404_1$.

Figure 16B:
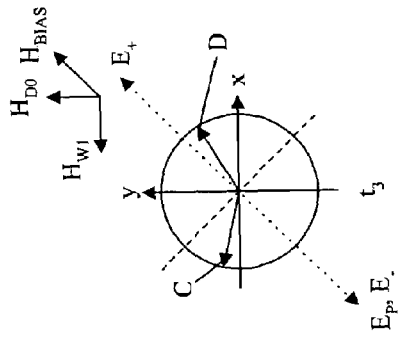
FIGS. 16(a)-16(e) illustrate states of a memory unit subjected to the sequence of signals shown in FIG. 15.
Figure 16C:
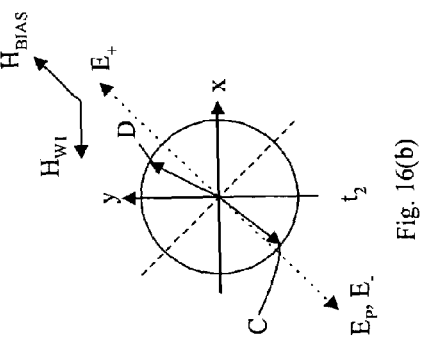
Figure 16A:
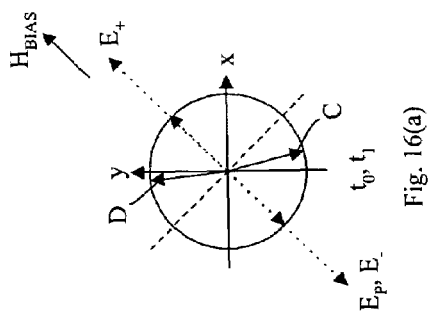

FIG. 16(a) shows magnetic moment vector C of ferromagnetic layer 432 and magnetic moment vector D of ferromagnetic layer 434 at times $t_0$ and $t_1$, when no word current or digit current is provided. Because of $H_{BIAS}$, magnetic moment vectors C and D, may rotate counterclockwise and respectively approach or pass the negative and positive x-axis.

As FIG. 16(b) shows, at time $t_2$, negative word current $I_{W1}$ is provided, generating a word magnetic field $H_{W1}$ substantially in the negative x-axis direction, i.e., at an angle of 135° with $H_{BIAS}$. In other words, $H_{W1}$ partially offsets $H_{BIAS}$. As a result, magnetic moment vectors C and D rotate clockwise and respectively approach or pass easy axes $E_-$ and $E_+$.

FIG. 16(c) shows magnetic moment vectors C and D at time $t_3$, when $I_{D0}$ is provided, inducing a digit magnetic field $H_{D0}$ substantially in the positive y-axis direction. As a result, magnetic moment vectors C and D rotate clockwise. Magnetic moment vector C may pass the negative x-axis, and magnetic moment vector D approaches the positive x-axis.

Figure 16E:
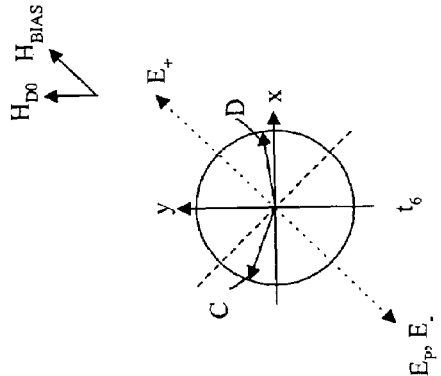
Figure 16D:
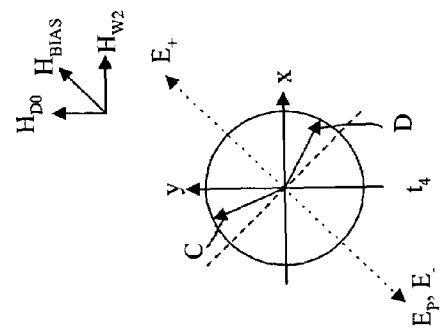

FIG. 16(d) shows magnetic moment vectors C and D at time $t_4$, when $I_{W1}$ is turned off and $I_{W2}$ is turned on, inducing a word magnetic field $H_{W2}$ in the positive x-axis direction. As a result, magnetic moment vectors C and D further rotate clockwise. Magnetic moment vector C approaches the positive y-axis and magnetic moment vector D may pass the positive x-axis.

FIG. 16(e) shows magnetic moment vectors C and D at time $t_6$, when $I_{W2}$ is turned off. Magnetic moment vectors C and D rotate counterclockwise. Magnetic moment vector C rotates back towards the negative x-axis and magnetic moment vector D rotates back towards and may pass the positive x-axis. As a result, magnetic moment vector C is closer to negative easy axis $E_-$ and magnetic moment vector D is closer to positive easy axis $E_+$.

At time $t_7$, $I_{D0}$ is turned off. Because magnetic moment vector C is closer to the negative easy axis $E_-$ direction and magnetic moment vector D is closer to the positive easy axis $E_+$ direction prior to time $t_7$, magnetic moment vectors C and D return to their respective original positions as shown in FIG. 16(a).

Thus, after the sequence of $I_{W1}$, $I_{D0}$, and $I_{W2}$ as shown in FIG. 15, magnetic moment vector C of ferromagnetic layer 432 and magnetic moment vector D of ferromagnetic layer 434 of memory unit $404_1$ remain at the same positions and memory unit $404_1$ has not changed state.

Consistent with embodiments of the present invention, more than one of memory cells 402 may be selected at the same time. For example, more than one of memory cells 402 may be read by activating one read word line RWL and multiple read bit lines RBL; more than one of memory cells 402 may be written by activating one write word line WWL and multiple write bit lines WBL. To read the selected memory cells 402, appropriate signals such as those shown in FIG. 5 are simultaneously applied to all of the selected memory cells 402. To write the selected memory cells 402, appropriate signals, such as those shown in FIGS. 6, 8, 9, 12, 14, or 15, are simultaneously applied to all of the selected memory cells 402. Because two bits of data may be read from or written into each memory cell 402 in one clock cycle, the number of bits of data read from or written into memory cells 402 of MRAM device 400 within each clock cycle is twice the number of memory cells 402 simultaneously selected. Therefore, the methods of operating MRAM device 400 consistent with embodiments of the present invention provide not only a high read bandwidth but also a high write bandwidth of MRAM 400.

Consistent with embodiments of the present invention, MRAM 400 also includes an appropriate interface for making the high read and write bandwidths available to external devices accessing MRAM 400.

A memory device communicates with external devices through a data bus including a number of data lines and control signal lines. The number of data lines in the data bus is equal to a number of bits of data that the memory device may simultaneously provide or receive, which is also referred to as a word size. Because each memory cell of conventional memory devices stores only one bit of datum, the word size of the conventional memory devices is equal to the number of memory cells that may be simultaneously selected. For example, if a memory device has 8 memory cells simultaneously selected, the memory device is connected to a data bus including 8 data lines for sending and receiving 8 bits of data in parallel.

However, as discussed above, MRAM device 400 consistent with embodiments of the present invention has a high read bandwidth and a high write bandwidth. In one aspect, MRAM device 400 is connectable to a data bus including a number of data lines equal to twice the number of memory cells 402 simultaneously selected when MRAM 400 is being accessed. For example, if 8 memory cells 402 are selected at the same time, a data bus including 16 data lines is connected to MRAM device 400 for simultaneously transferring 16 bits of data. Therefore, the word size of MRAM device 400 is twice that of a conventional MRAM device having 8 memory cells simultaneously selected.

In another aspect, MRAM device 400 is connectable to a data bus including a number of data lines as many as a number of memory cells 402 simultaneously selected when MRAM 400 is being accessed. For example, if 8 memory cells 402 are selected at the same time, then the data bus includes only 8 lines. However, MRAM device 400 includes an I/O circuit for transferring two bits of data per clock cycle through each of the data lines. Particularly, the I/O circuit has an input portion and an output portion. The input portion receives in series two bits of data to be written into a selected memory cell 402 through one of the data lines and parallelizes the two bits for simultaneous transfer to the writing circuit, which then writes the two bits simultaneously into the selected memory cell 402. The output portion receives two bits of data in parallel from sense amplifier 408 and queues the two bits for serial transfer onto one of the data lines within one clock cycle. For example, one bit may be transferred during the first half of a clock cycle and the other bit may be transferred during the second half of the clock cycle. Therefore, although the word size of MRAM 400 is the same as that of a conventional MRAM device having 8 memory cells simultaneously selected, the number of bits transferred through each data line within the same period of time, i.e., the per-line data transfer rate, is doubled.

Figure 17:
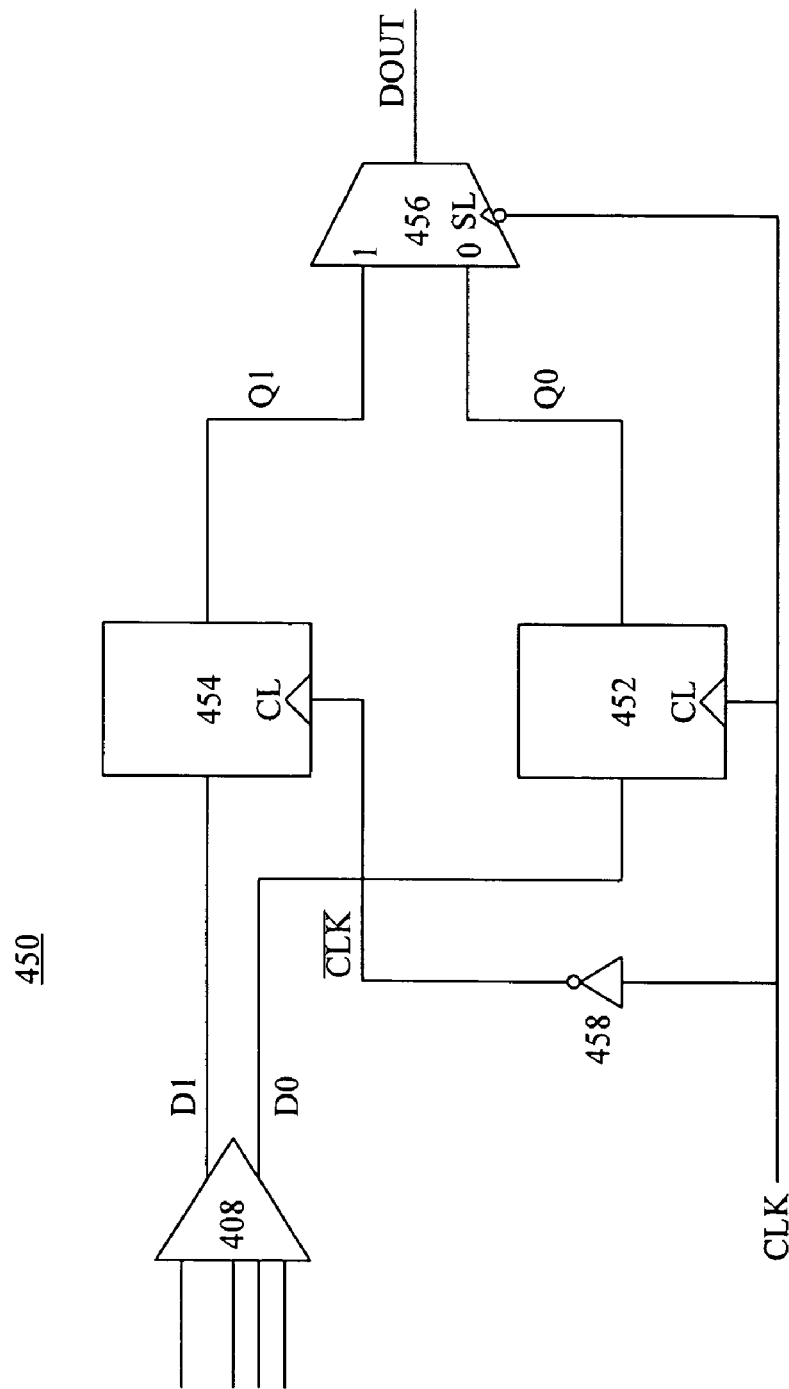
FIG. 17 shows a portion of an exemplary I/O circuit of the MRAM device shown in FIG. 4A.

The I/O circuit may comprise any suitable logic circuit. FIG. 17 shows as an example an output portion 450 of an I/O circuit in MRAM device 400 for queuing data consistent with embodiments of the present invention. Output portion 450 includes two shift registers 452 and 454 and a multiplexer 456. Shift registers 452 and 454 respectively receive data outputs D0 and D1 from sense amplifier 408 and respectively output the same data on a rising edge of a clock signal (CL). Particularly, referring to FIG. 17, when the CL signal of shift register 452 rises from "0" to "1", an output of shift register 452, Q0, is set to be D0; when the CL signal of shift register 454 rises from "0" to "1", an output of shift register 454, Q1, is set to be D1. The clock signal CLK is provided to shift register 452 as the CL signal thereof. An inverted clock signal $\overline{CLK}$, which is the clock signal CLK inverted by an inverter 458, is provided to shift register 454 as the CL signal thereof. Multiplexer 456 receives Q0 and Q1 as input, and outputs one of Q0 and Q1 in accordance with a select (SL) signal. For example, when SL is "1", the output of multiplexer 456, DOUT, is Q0; when SL is "0", Q1 is output as DOUT. The clock signal CLK is provided to multiplexer 456 as the SL signal thereof.

Figure 18:
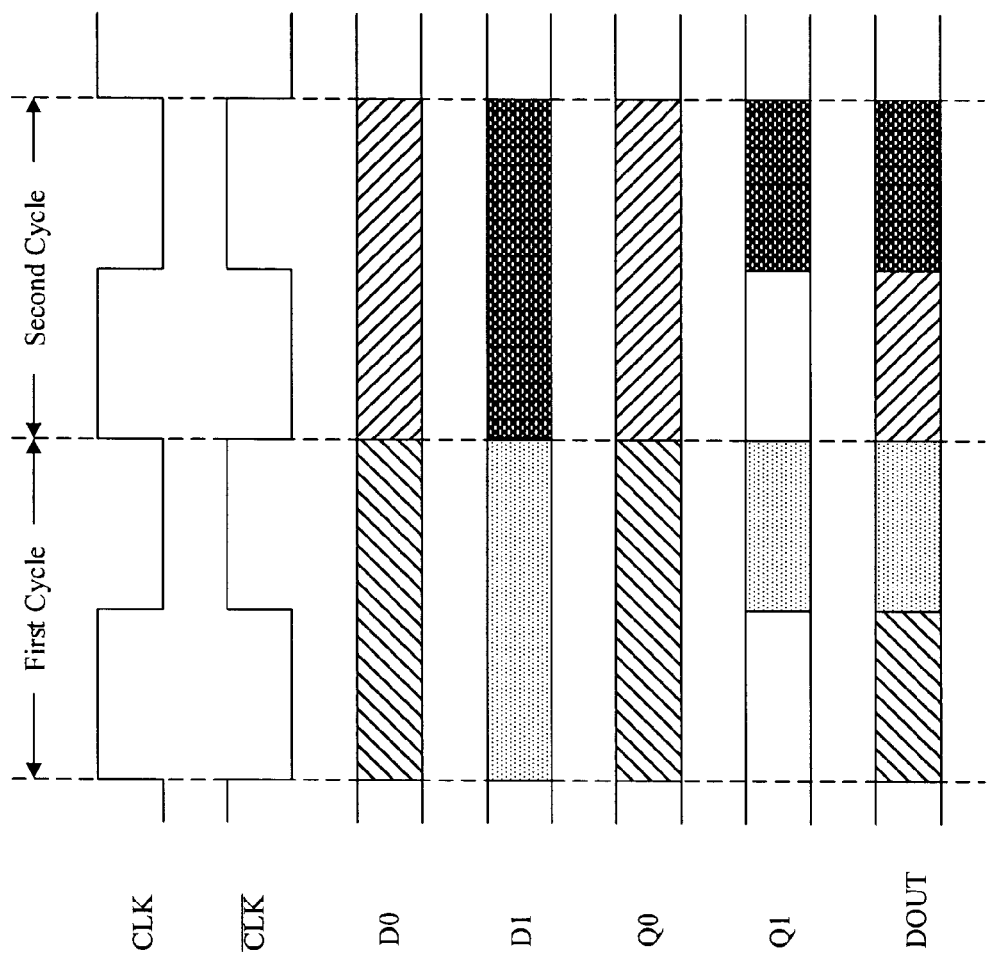
FIG. 18 illustrates two exemplary clock cycles of a process performed by the portion of the I/O circuit shown in FIG. 17.

FIG. 18 illustrates two exemplary clock cycles, a first cycle and a second cycle, of the process of queuing two bits of data by output portion 450 of the I/O circuit shown in FIG. 17. Consider the first cycle as an example. Shift register 452 shifts D0 out as the output Q0 when the clock signal CLK rises at the beginning of the first cycle. Thus, throughout the first cycle, Q0 is the same as D0. Shift register 454 shifts D1 out as the output Q1 when the inverted clock signal $\overline{CLK}$ rises at the center point of the first cycle. Thus, Q1 is the same as D1 through the second half of the first cycle. Because the clock signal CLK, which is the SL signal of multiplexer 456, is "1" during the first half of the first cycle and is "0" during the second half of the first cycle, Q0 is output as DOUT during the first half of the first cycle, and Q1 is output as DOUT during the second half of the first cycle. Thus, two bits of data, D0 and D1, are output in series within one clock cycle. The same process is repeated in the second cycle and subsequent clock cycles.

As persons of ordinary skill will now appreciate, the input portion of the I/O circuit of MRAM 400 may be similarly constructed to enable parallelization of two bits of data serially transferred within one clock cycle. Therefore, such a construction is not shown in the drawing figures or described herein.

By queuing two bits of data for serial transmission in one clock cycle and rearranging two bits of data received within one clock cycle for parallel transmission, the I/O circuit of MRAM device 400 consistent with embodiments of the present invention enables a per-line data transfer rate that is twice the per-line data rate of a conventional MRAM device.

By either increasing the word size or increasing the per-line data transfer rate, the high read and write bandwidths of MRAM device 400 consistent with embodiments of the present invention may be fully utilized.

Figure 19:
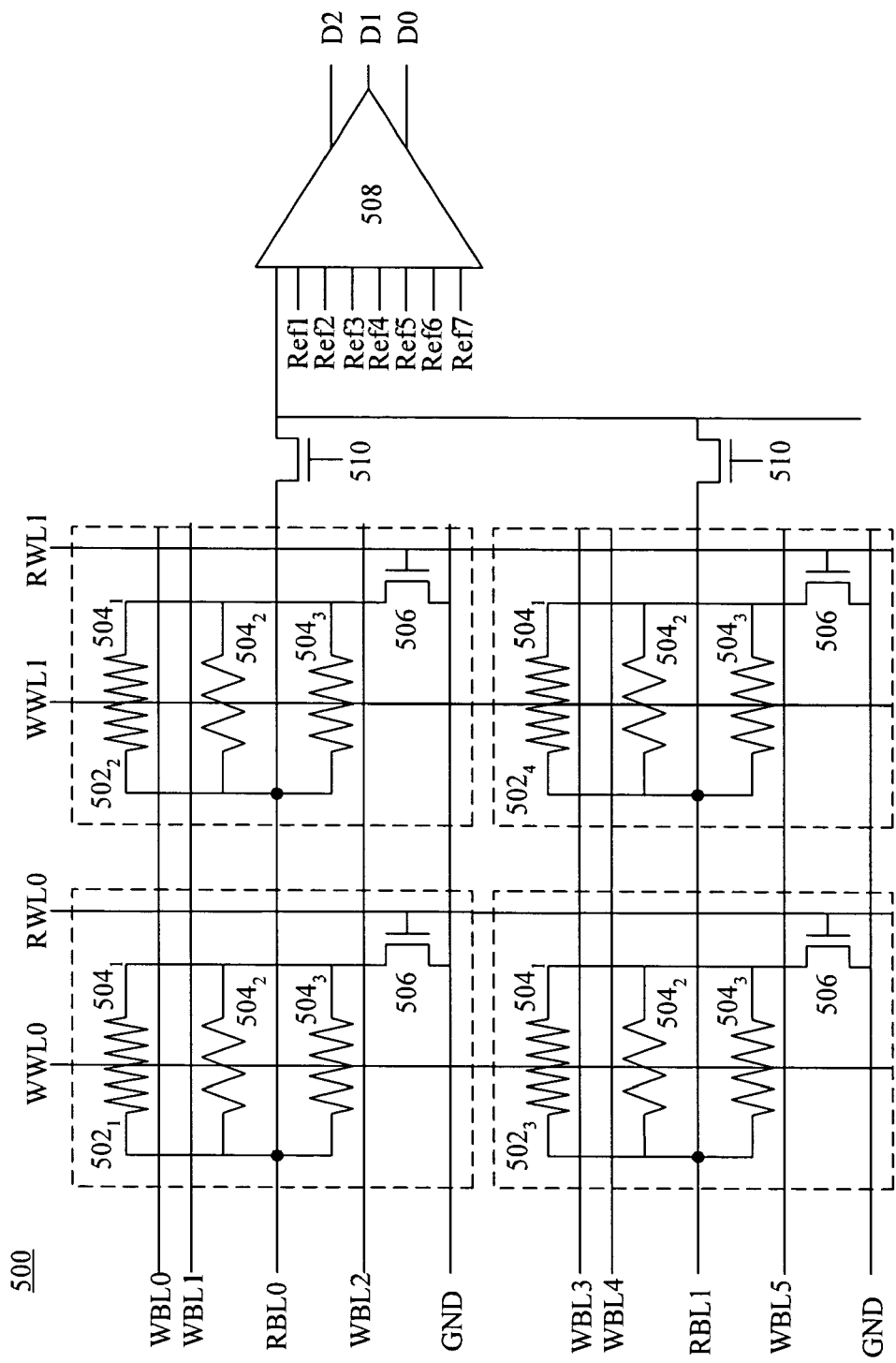
FIG. 19 shows an MRAM device consistent with a fourth embodiment of the present invention.

FIG. 4A shows each memory cell 402 of MRAM device 400 to include two memory units 404. However, consistent with embodiments of the present invention, each memory cell of an MRAM device may include more than two memory units. FIG. 19 shows an MRAM device 500 consistent with a fourth embodiment of the present invention. MRAM device 500 includes an array of memory cells 502, four of which, $502_1$, $502_2$, $502_3$, $502_4$ are shown. Each memory cell 502 corresponds to a read bit line RBL, a read word line RWL, a write word line WWL, and three write bit lines WBL. FIG. 19 shows that each memory cell 502 includes three memory units 504, i.e., memory units $504_1$, $504_2$, and $504_3$, connected in parallel between a transistor 506 and the corresponding read bit line RBL, where a gate of transistor 506 is connected to the corresponding read word line RWL. Each memory unit 504 corresponds to one of the three write bit lines WBL. As FIG. 19 shows, memory cells $502_1$ and $502_2$ correspond to a first read bit line RBL0, a first write bit line WBL0, a second write bit line WBL1, and a third write bit line WBL2; memory cells $502_3$ and $502_4$ correspond to a second read bit line RBL1, a fourth write bit line WBL3, a fifth write bit line WBL4, and a sixth write bit line WBL5; memory cells $502_1$ and $502_3$ correspond to a first read word line RWL0 and a first write word line WWL0; and memory cells $502_2$ and $502_4$ correspond to a second read word line RWL1 and a second write word line WWL1. A sense amplifier 508 is coupled to each read bit line RBL through a select transistor 510 to detect a current through a selected one of memory cells 502.

Consistent with the fourth embodiment of the present invention, memory units $504_1$, $504_2$, and $504_3$ in each memory cell 502 of MRAM device 500 are fabricated such that a resistance of each of memory cells 502 has a different value corresponding to a different state of the corresponding memory cell 502. In other words, eight parallel resistances, $R_{1max}//R_{2max}//R_{3max}$, $R_{1max}//R_{2max}//R_{3min}$, $R_{1max}//R_{2min}//R_{3max}$, $R_{1max}//R_{2min}//R_{3min}$, $R_{1min}//R_{2max}//R_{3max}$, $R_{1min}//R_{2max}//R_{3min}$, $R_{1min}//R_{2min}//R_{3max}$, $R_{1min}//R_{2min}//R_{3min}$, all have different values, where $R_{1max}$ is the high resistance of memory unit $504_1$, $R_{1min}$ is the low resistance of memory unit $504_1$, $R_{2max}$ is the high resistance of memory unit $504_2$, $R_{2min}$ is the low resistance of memory unit $504_2$, $R_{3max}$ is the high resistance of memory unit $504_3$, and $R_{3min}$ is the low resistance of memory unit $504_3$. Therefore, three bits of data may be stored in each memory cell 502 and may be read out simultaneously. Particularly, sense amplifier 508 compares the detected current through the selected memory cell 502 with seven intermediate reference current values Ref1~Ref7, which correspond to reference resistance values between the eight parallel resistances, and finds the one of the eight parallel resistances that is the closest to the resistance of the selected memory cell 502. Once the corresponding parallel resistance is found, the states of memory units 504 of the selected memory cell 502 are determined and three bits of data D0, D1, and D2 are output simultaneously.

To write a selected memory cell 502, a logic circuit (not shown) first reads the data stored in memory units 504 of the selected memory cell 502 and compares the same with the data to be written into memory units 504. If a memory unit 504 has stored therein a bit of datum the same as the datum to be written thereto, no writing operation is performed. Otherwise, the state of the memory unit is changed, or "toggled". If more than one of memory units 504 of a selected memory cell 502 need to be toggled, writing currents may be simultaneously provided to the corresponding write word line and the write bit lines corresponding to the memory units to be toggled.

The processes of reading and writing a selected memory cell 502 should now be apparent to one skilled in the art and are not described in detail herein.

MRAM device 500 may be connectable to a data bus including a number of data lines three times a number of memory cells 502 simultaneously selected when MRAM 500 is being accessed. For example, if 8 memory cells 502 are selected at the same time, a data bus including 24 data lines may be connected to MRAM device 500 for receiving and sending 24 bits of data in parallel. Therefore, the word size of MRAM device 500 is three times that of a conventional MRAM device having 8 memory cells simultaneously selected.

Alternatively, MRAM device 500 may be connectable to a data bus including a number of data lines equal to a number of memory cells 502 simultaneously selected when MRAM 500 is being accessed. For example, if 8 memory cells 502 are selected at the same time, then the data bus includes only 8 data lines. However, MRAM device 500 further includes an I/O circuit for transferring three bits of data per clock cycle through each of the data lines. For example, the I/O circuit may have an output portion for queuing three bits of data read from a selected memory cell 502, such that a first bit is transferred during the first quarter of a clock cycle, a second bit is transferred during the second quarter of a clock cycle, and a third bit is transferred during the third quarter of a clock cycle. The I/O circuit may also include an input portion for parallelizing three bits of data to be written into a selected memory cell 502 such that the three bits are transferred in parallel to the writing circuit for simultaneous writing into memory units 504 of the selected memory cell 502. Thus, although the word size of MRAM 500 does not change, the per-line data transfer rate is tripled.

Figure 20:
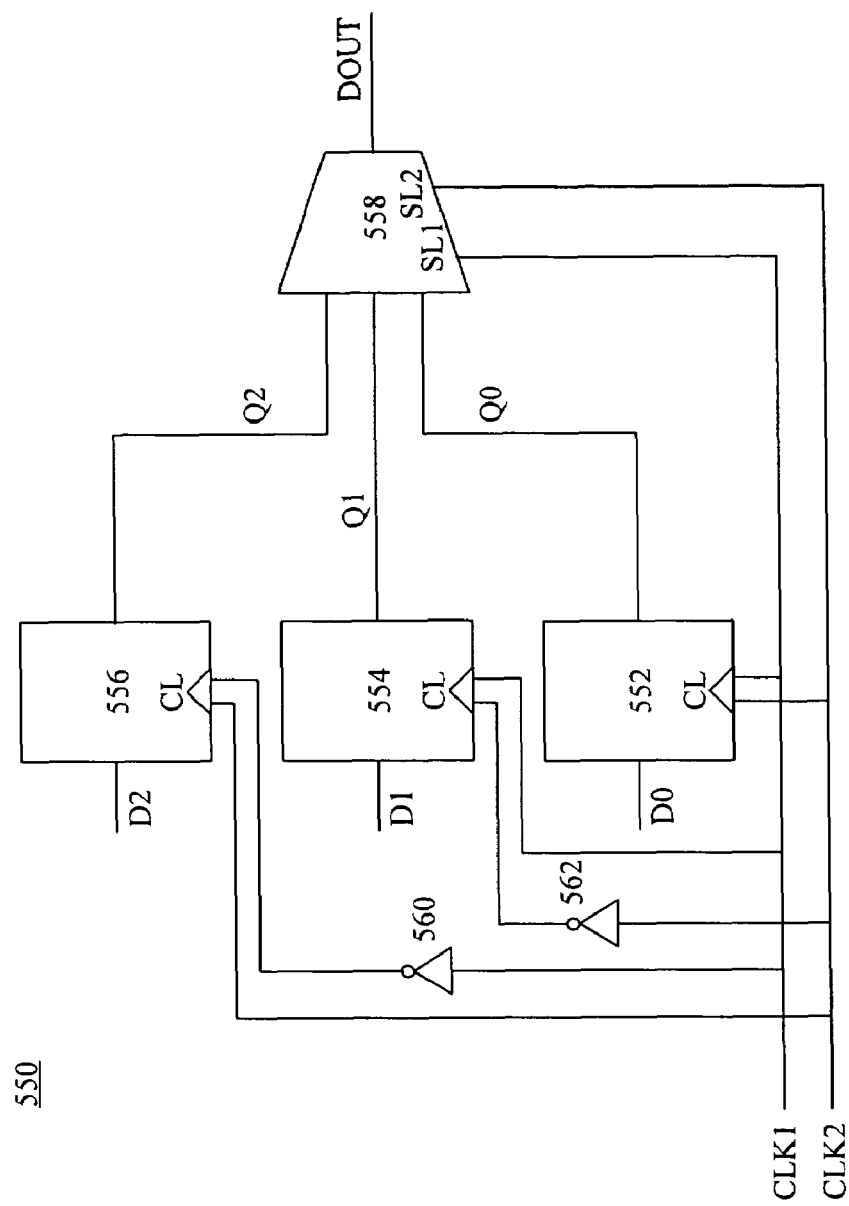
FIG. 20 shows a portion of an exemplary I/O circuit of the NRAM device shown in FIG. 19.

The I/O circuit consistent with the fourth embodiment of the present invention may comprise any suitable logic circuit for the purpose. For example, FIG. 20 shows an exemplary output portion 550 of the I/O circuit of MRAM device 500 consistent with the fourth embodiment of the present invention. As FIG. 20 shows, output portion 550 includes three shift registers 552, 554, and 556, and a multiplexer 558. Shift registers 552, 554, and 556 respectively receive data outputs D0, D1, and D2 from sense amplifier 508, and respectively output the same data as Q0, Q1, and Q2 on a rising edge of a clock signal (CL). Two external clock signals, CLK1 and CLK2, are provided to generate clock signals for shift registers 552, 554, and 556, where the frequency of CLK2 is twice the frequency of CLK1. Particularly, the clock signal of shift register 552 is AND(CLK1, CLK2), the clock signal of shift register 554 is AND(CLK1, $\overline{\text{CLK2}}$), and the clock signal of shift register 556 is AND($\overline{\text{CLK1}}$, CLK2), where $\overline{\text{CLK1}}$ and $\overline{\text{CLK2}}$ are CLK1 and CLK2 respectively inverted by inverters 560 and 562. Thus, when AND(CLK1, CLK2) rises, shift register 552 shifts D0 out as Q0; when AND(CLK1, $\overline{\text{CLK2}}$) rises, shift register 554 shifts D1 out as Q1; and when AND($\overline{\text{CLK1}}$, CLK2) rises, shift register 556 shifts D2 out as Q2.

Multiplexer 558 receives Q0, Q1, and Q2 as input, and outputs one of Q0, Q1, and Q2 in accordance with two select signals, SL1 and SL2. Particularly, when SL1 and SL2 are both "1", Q0 is output as DOUT; when SL1 is "1" and SL2 is "0", Q1 is output as DOUT; and when SL1 is "0" and SL2 is "1", Q2 is output as DOUT. When SL1 and SL2 are both "0", multiplexer 558 may set the output DOUT to be floating.

Figure 21:
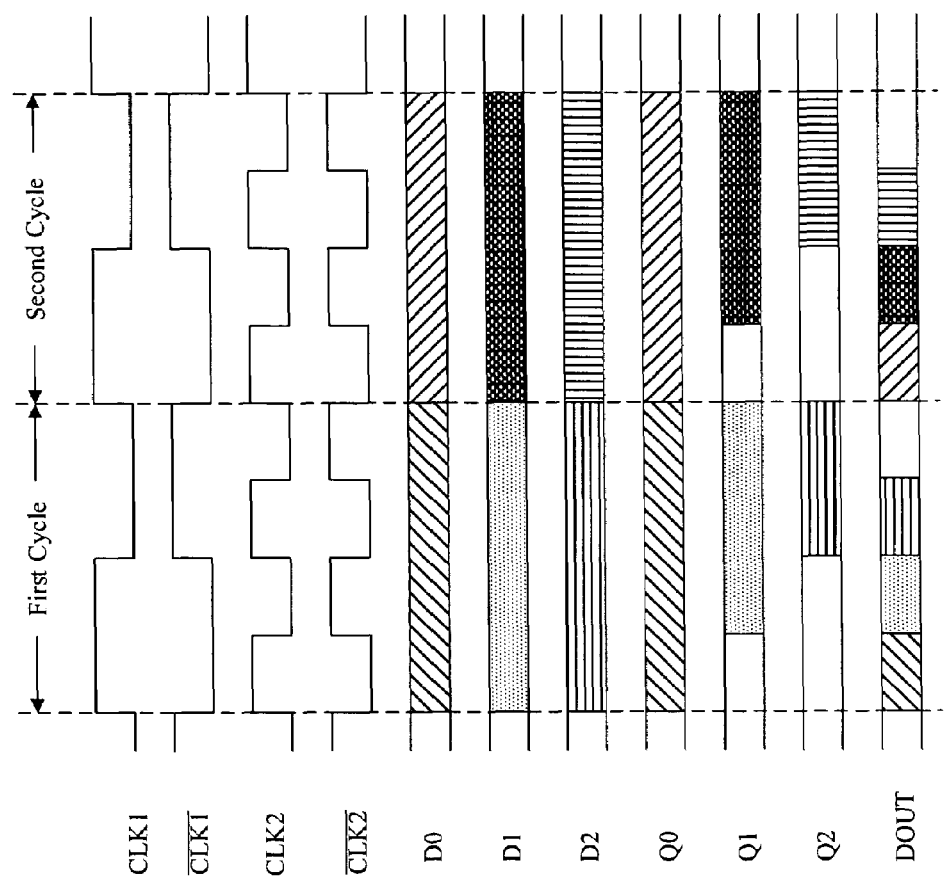
FIG. 21 illustrates two exemplary clock cycles of a process performed by the portion of the I/O circuit shown in FIG. 20.

FIG. 21 illustrates two clock cycles, a first cycle and a second cycle, of the process of queuing D0, D1, D2, by output portion 550. The process of queuing the three bits of data should now be understood by one skilled in the art and is therefore not described in detail herein.

The input portion of the I/O circuit of MRAM 500 may be similarly constructed and is also not shown in the drawing figures or described herein.

Thus, consistent with the fourth embodiment of the present invention, an MRAM device with three memory units in each memory cell thereof is capable of transferring a number of bits of data per clock cycle three times a number of memory cells that may be simultaneously selected, either with a tripled word size or with a tripled per-line data transfer rate.

Similarly, consistent with embodiments of the present invention, an MRAM device may have four or more memory units in each memory cell thereof to increase a bandwidth thereof, and may communicate with external devices through a data bus with an increased word size or an increased per-line data transfer rate.

The above descriptions of embodiments of the present invention assumed for convenience that the word currents or digit currents are provided in a manner such that moment vectors C and D rotate in a certain direction. However, it is to be understood that moment vectors C and D may rotate in both clockwise and counterclockwise directions. For example, in contrast to the sequence of signals shown in FIG. 6, and also consistent with the second embodiment of the present invention, to toggle write memory unit 404$_2$ of memory cell 402$_1$, a positive word current $I_W$ may be provided through write word line WWL0 between time $t_2$ and time $t_4$, and a positive digit current $I_D$ may be provided through write bit line WBL1 between time $t_3$ and time $t_5$. As a result, moment vectors C and D will rotate counterclockwise, in contrast to the clockwise rotation shown in FIGS. 7(a)-7(e). For another example, in contrast to the sequence of signals shown in FIG. 12, and also consistent with the third embodiment of the present invention, to write memory unit 404$_2$ of memory cell 402$_1$, a negative digit current may be provided between time $t_2$ and time $t_4$, a positive digit current may be provided between time $t_4$ and time $t_6$, a positive word current may be provided between time $t_3$ and time $t_5$, and a negative word current may be provided between time $t_5$ and time $t_7$. As a result, moment vectors C and D will rotate counterclockwise, in contrast to the clockwise rotation shown in FIGS. 13(a)-13(g).

In the above descriptions, it was assumed that the easy axes $E_+$ and $E_-$ are at an angle of about 45° with the x-axis and y-axis. However, it is to be understood that the easy axes do not have to be at a particular angle with the x-axis and y-axis, but rather may be at any angle with the x-axis or y-axis. Methods for writing memory units 404 or 504 may be modified accordingly. For example, consistent with the second embodiment of the present invention, when the easy axes of the free magnetic region are at random angles with the read word line and digit line, two sequential current pulses may be provided to write a memory unit 404, where each of the two pulses is a combination of both a word current and a digit current, rather than a word current or a digit current alone. For another example, consistent with the third embodiment of the present invention, when the easy axes of the free magnetic region are at random angles with the read word line and digit line, four sequential current pulses may be provided to write a memory unit, where each of the four pulses is a combination of both a word current and a digit current.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for accessing a memory cell of a magnetoresistive random access memory (MRAM) device, the memory cell comprising a plurality of memory units each for storing a bit of datum, the method comprising:
   writing the memory cell, comprising
      identifying ones of the memory units, each of the ones of the memory units having stored therein a datum different from a datum to be written thereto; and
      simultaneously writing all of the ones of the memory units.

2. The method of claim 1, wherein identifying the ones of the memory units comprises:
   reading a datum stored in each of memory units; and
   comparing the datum stored in each of the memory units with a datum to be written thereto.

3. The method of claim 2, wherein the MRAM device is operable by a clock signal, and wherein reading the datum stored in each of the memory units, comparing the datum stored in each of the memory units with a datum to be written thereto, and writing the memory cell are all performed within one cycle of the clock signal.

4. The method of claim 1, wherein simultaneously writing all of the ones of the memory units comprises:
   subjecting the ones of the memory units to a first magnetic field in a first direction between a first time point and a second time point; and
   subjecting the ones of the memory units to a second magnetic field in a second direction between a third time point and a fourth time point, the second direction being substantially perpendicular to the first direction.

5. The method of claim 4, wherein the memory cell corresponds to a write word line and each of the memory units corresponds to one of a plurality of write bit lines, wherein
   subjecting the ones of the memory units to the first magnetic field comprises providing a first current through the write word line; and
   subjecting the ones of the memory units to the second magnetic field comprises, for each of the ones of the memory units, providing a second current through the corresponding write bit line.

6. The method of claim 4, wherein the memory cell corresponds to a write word line and each of the memory units corresponds to one of a plurality of write bit lines, wherein
   subjecting the ones of the memory units to the first magnetic field comprises, for each of the ones of the memory units, providing a first combination of currents through the write word line and the corresponding write bit line; and
   subjecting the ones of the memory units to the second magnetic field comprises, for each of the ones of the memory units, providing a second combination of currents through the write word line and the corresponding write bit line.

7. The method of claim 4, wherein the third time point precedes the first time point, the first time point precedes the fourth time point, and the fourth time point precedes the second time point.

8. The method of claim 4, wherein the first time point precedes the third time point, the third time point precedes the second time point, and the second time point precedes the fourth time point.

9. The method of claim 1, wherein simultaneously writing the ones of the memory units comprises:
   subjecting the ones of the memory units to a first magnetic field in a first direction between a first time point and a second time point;
   subjecting the ones of the memory units to a second magnetic field in a second direction between the second time point and a third time point, the second direction being substantially opposite to the first direction;
   subjecting the ones of the memory units to a third magnetic field in a third direction between a fourth time point and a fifth time point, the third direction being substantially perpendicular to the first direction; and
   subjecting the ones of the memory units to a fourth magnetic field in a fourth direction between the fifth time point and a sixth time point, the fourth direction being substantially opposite to the first direction.

10. The method of claim 9, wherein the memory cell corresponds to a write word line and each of the memory units corresponds to one of a plurality of write bit lines, wherein
    subjecting the ones of the memory units to the first magnetic field comprises providing a first current through the write word line;
    subjecting the ones of the memory units to the second magnetic field comprises providing a second current through the write word line;
    subjecting the ones of the memory units to the third magnetic field comprises, for each of the ones of the memory units, providing a third current through the corresponding write bit line; and
    subjecting the ones of the memory units to the fourth magnetic field comprises, for each of the ones of the memory units, providing a fourth current through the corresponding write bit line.

11. The method of claim 9, wherein the memory cell corresponds to a write word line and each of the memory units corresponds to one of a plurality of write bit lines, wherein
    subjecting the ones of the memory units to each of the first magnetic field, the second magnetic field, the third magnetic field, and the fourth magnetic field comprises, for each of the ones of the memory units, providing a respective combination of currents through the write word line and the corresponding write bit line.

12. The method of claim 9, wherein the first time point precedes the fourth time point, the fourth time point precedes the second time point, the second time point precedes the fifth time point, the fifth time point precedes the third time point, and the third time point precedes the sixth time point.

13. The method of claim 9, wherein the fourth time point precedes the first time point, the first time point precedes the fifth time point, the fifth time point precedes the second time point, the second time point precedes the sixth time point, and the sixth time point precedes the third time point.

14. The method of claim 9, the method further comprising subjecting the memory units to a bias magnetic field, wherein
    subjecting the ones of the memory units to the first magnetic field comprises subjecting the ones of the memory units to a magnetic field at an angle greater than 90° with a direction of the bias magnetic field, and
    subjecting the ones of the memory units to the third magnetic field comprises subjecting the ones of the memory units to a magnetic field at an angle smaller than 90° with a direction of the bias magnetic field.

15. The method of claim 1, wherein each memory unit comprises a free magnetic region having two easy axes anti-parallel to each other, the method further comprising subjecting the memory units to a bias magnetic field in a direction of one of the two easy axes.

16. The method of claim 15, wherein the memory cell corresponds to a write word line and each of the memory units corresponds to a write bit line, and wherein the two easy axes are in a direction non-parallel to the write word line or the write bit line of each of the memory units.

17. The method of claim 15, wherein the memory cell corresponds to a write word line and each of the memory units corresponds to a write bit line, the write bit line corresponding to each of the memory units is substantially perpendicular to the write word line, and wherein the two easy axes are substantially at an angle of 45° with the write word line and the write bit line of each of the memory units.

18. The method of claim 1, further comprising reading the memory cell, wherein reading the memory cell comprises:
applying a voltage drop across the memory cell;
detecting a current through the memory cell; and
comparing the detected current with a plurality of reference current values to determine the bit of datum stored in each of memory units.

* * * * *